US010514541B2

(12) United States Patent
Tantos et al.

(10) Patent No.: US 10,514,541 B2
(45) Date of Patent: Dec. 24, 2019

(54) DISPLAY UPDATE TIME REDUCTION FOR A NEAR-EYE DISPLAY

(71) Applicant: Microsoft Technology Licensing, LLC, Redmond, WA (US)

(72) Inventors: Andras Tantos, Bellevue, WA (US); Rod G. Fleck, Bellevue, WA (US); Jedd Perry, Monroe, WA (US); David D. Bohn, Fort Collins, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 593 days.

(21) Appl. No.: 13/728,892

(22) Filed: Dec. 27, 2012

(65) Prior Publication Data

US 2014/0184475 A1    Jul. 3, 2014

(51) Int. Cl.
*G02B 27/01* (2006.01)
*H04N 21/2343* (2011.01)
(Continued)

(52) U.S. Cl.
CPC .......... *G02B 27/017* (2013.01); *H03M 13/03* (2013.01); *H03M 13/356* (2013.01);
(Continued)

(58) Field of Classification Search
USPC .......................................................... 345/8
See application file for complete search history.

(56) References Cited

U.S. PATENT DOCUMENTS 7,492,821 B2    2/2009  Berman et al.
7,556,377 B2    7/2009  Beymer
(Continued)

FOREIGN PATENT DOCUMENTS

CN    1084728 A    4/1994
CN    1119809 A    4/1996
(Continued)

OTHER PUBLICATIONS

PCT Demand and Response including Amendments to Written Opinion, filed Aug. 11, 2014 in PCT Application No. PCT/US2013/076705, 20 pages.
(Continued)

*Primary Examiner* — William Boddie
*Assistant Examiner* — Andrew B Schnirel
(74) *Attorney, Agent, or Firm* — Ranjeev Singh; Singh Law, PLLC

(57) ABSTRACT

Technology is described for reducing display update time for a near-eye display (NED) device. A point of focus in the NED field of view is identified, often based on natural user input data. A communication module of a computer system communicatively coupled to the NED device transmits lossless priority data, an example of which is user focal region image data, using one or more communication techniques for satisfying lossless transmission criteria. Allowed loss image data is identified based at least in part on its distance vector from a point of focus in the display field of view. An example of allowed loss image data is image data to be displayed outside the user focal region. The allowed loss image data is transmitted and extracted from received image data allowing for lossy transmission.

20 Claims, 13 Drawing Sheets

(51) Int. Cl.
| | |
|---|---|
| *H03M 13/35* | (2006.01) |
| *H04N 21/2383* | (2011.01) |
| *H03M 13/03* | (2006.01) |
| *G02B 27/00* | (2006.01) |
| *H04N 19/167* | (2014.01) |
| *H04N 19/67* | (2014.01) |

(52) U.S. Cl.
CPC . *H04N 21/2383* (2013.01); *H04N 21/234318* (2013.01); *H04N 21/234345* (2013.01); *H04N 21/234354* (2013.01); *G02B 27/0093* (2013.01); *G02B 2027/014* (2013.01); *G02B 2027/0127* (2013.01); *G02B 2027/0178* (2013.01); *H04N 19/167* (2014.11); *H04N 19/67* (2014.11)

(56) References Cited

U.S. PATENT DOCUMENTS

| | | | |
|---|---|---|---|
| 7,679,622 | B2 | 3/2010 | Lee et al. |
| 7,894,682 | B2 | 2/2011 | Kortum et al. |
| 8,184,069 | B1 | 5/2012 | Rhodes |
| 2001/0055311 | A1* | 12/2001 | Trachewsky et al. ........ 370/445 |
| 2002/0105482 | A1* | 8/2002 | Lemelson ............ G06F 3/0485 345/7 |
| 2002/0180756 | A1* | 12/2002 | Lee et al. ...................... 345/619 |
| 2006/0271612 | A1 | 11/2006 | Ritter et al. |
| 2009/0042511 | A1* | 2/2009 | Malladi .......................... 455/62 |
| 2009/0096927 | A1 | 4/2009 | Camp et al. |
| 2009/0189974 | A1 | 7/2009 | Deering |
| 2009/0319178 | A1* | 12/2009 | Khosravy et al. ............ 701/207 |
| 2012/0092328 | A1 | 4/2012 | Flaks et al. |
| 2012/0127062 | A1 | 5/2012 | Bar-Zeev et al. |
| 2012/0178368 | A1 | 7/2012 | Fleck et al. |
| 2012/0178380 | A1 | 7/2012 | Fleck et al. |

FOREIGN PATENT DOCUMENTS

| | | |
|---|---|---|
| CN | 101677762 A | 3/2010 |
| CN | 102681811 A | 9/2012 |
| JP | H043218 A | 1/1992 |
| JP | H06284449 A | 10/1994 |
| JP | H08234141 A | 9/1996 |
| JP | 09224267 A | 8/1997 |
| JP | 2000049748 A | 2/2000 |
| JP | 2002508607 A | 3/2002 |
| JP | 2002519953 A | 7/2002 |
| JP | 2003520494 A | 7/2003 |
| JP | 2005512418 A | 4/2005 |
| JP | 2010258724 A | 11/2010 |

OTHER PUBLICATIONS

International Search Report and Written Opinion dated Apr. 10, 2014 in PCT Application No. PCT/US2013/076705, 13 pages.
Jong-Seok Lee et al.: "Perceptual Video Compression: A Survey", IEEE Journal of Selected Topics in Signal Processing, IEEE, US, vol. 6, No. 6, Oct. 1, 2012, pp. 684-697,14 pages.
Bahl P et al.: "H.263 based video codec for real-time visual communications over wireless radio networks", 1997 IEEE 6th. International Conference on Universal Personal Communications Record. San Diego, Oct. 12-16, 1997; [IEEE International Conference on Universal Personal Communications], New York, IEEE, US, vol. 2, Oct. 12, 1997, pp. 773-779, 7 pages.
Schertz and C Weck A: "Hierarchical modulation the transmission of two independent DVB-T multiplexes on a single frequency", E B U Technical Review, European Broadcasting Union, CH, Apr. 1, 2003, pp. 1-13, 13 pages.
Jiang H et al.: "A Hierarchical Modulation for Upgrading Digital Broadcast Systems", IEEE Transactions on Broadcasting, IEEE Service Center, Piscataway, NJ, US, vol. 51, No. 2, Jun. 1, 2005, pp. 223-229, 7 pages.
Kodikara Arachchi H et al.: "Unequal Error Protection Technique for ROI Based H.264 Video Coding", Electrical and Computer Engineering, Canadian Conference on, IEEE, PI, May 1, 2006, pp. 2033-2036, 4 pages.
Hannuksela M M et al.: "Sub-picture: ROI coding and unequal error protection", International Conference on Image Processing (ICIP), IEEE, vol. 3, Sep. 22, 2002, pp. 537-540, 4 pages.
Olivier Le Meur et al.: "What we see is most likely to be what matters: Visual attention and applications", Image Processing (ICIP), 2009 16th IEEE International Conference on, IEEE, Piscataway, NJ, USA, Nov. 7, 2009, pp. 3085-3088, 4 pages.
Billinghurst et al., "MagicBook: Transitioning between Reality and Virtuality," Proceedings of the 2001 Conference on Human Factors in Computing Systems (CHI '01), Mar. 31-Apr. 5, 2001, Seattle, WA, USA. 2 pages.
Forte, et al., "Adaptable Video Compression and Transmission Using Lossy and Workload Balancing Techniques", 2011 NASA/EAS Conference on Adaptive Hardware and Systems (AHS-2011) AHS, pp. 145-152 IEEE Jun. 6-9, 2011, 8 pages.
Grasset, et al., "The Design of a Mixed-Reality Book: Is It Still a Real Book?," Proceedings of the 7th IEEE/ACM International Symposium on Mixed and Augmented Reality, Sep. 15-18, 2008, pp. 99-102, 4 pages.
Grasset, et al., "Edutainment with a Mixed Reality Book: A Visually Augmented Illustrative Childrens' Book," Proceedings of the International Conference on Advances in Computer Entertainment Technology, 2008, pp. 292-295, 4 pages.
Lee, et al., "Foveated Video Compression with Optimal Rate Control", IEEE Transactions on Image Processing, vol. 10, Issue 7, Jul. 2001,16 pages.
Liarokapis, Fotis, "An Augmented Reality Interface for Visualizing and Interacting with Virtual Content", Draft Paper to Appear in Journal of Virtual Reality, vol. 11, Issue 1, Feb. 2007, 18 pages.
Yang et al., "Visual Important-Driven Interactive Rendering of 3D Geometry Model over Lossy WLAN", Journal of Networks, vol. 6, No. 11, pp. 1594-1601, Academy Publisher Nov. 2011, 8 pages.
Written Opinion of the International Preliminary Examining Authority, filed Sep. 11, 2014 in PCT Application No. PCT/US2013/076705, 7 pages.
Lester C. Loschky et al: "User performance with Gaze Contingent Multiresolutional Displays", Eye Tracking Research & Applications Symposium 2000, Palm Beach Gardens, FL, USA, pp. 97-103.
Response to Second Written Opinion of the International Preliminary Examining Authority filed Dec. 11, 2014 in PCT Application No. PCT/US2013/076705.
International Preliminary Report on Patentability dated Apr. 7, 2015 in PCT Application No. PCT/US2013/076705.
Communication pursuant to Rule 161(1) and 162 EPC dated Aug. 4, 2015 in European Patent Application No. 13824559.2.
Response to Office Action filed Nov. 11, 2015 in European Patent Application No. 13824559.2.
Request for Examination and Voluntary Amendment filed Nov. 30, 2016 in Japanese Patent Application No. 2015-550679, 10 pages.
"Office Action Issued in European Patent Application No. 13824559.2", dated Feb. 9, 2017, 5 Pages.
"First Office Action and Search Report Issued in Chinese Patent Application No. 201380068578.4", dated Nov. 24, 2017, 16 Pages.
"Second Office Action Issued in Chinese Patent Application No. 201380068578.4", dated Jul. 9, 2018, 10 Pages.
"Notice of Allowance Issued in Japanese Patent Application No. 2015-550679", dated Oct. 30, 2018, 5 Pages.
"Office Action Issued in Japanese Patent Application No. 2015-550679", dated Feb. 6, 2018, 9 Pages.
"Third Office Action Issued in Chinese Patent Application No. 201380068578.4", dated Jan. 21, 2019, 7 Pages.
"Final Rejection Issued in Chinese Patent Application No. 201380068578.4", dated Apr. 16, 2019, 8 Pages.

* cited by examiner

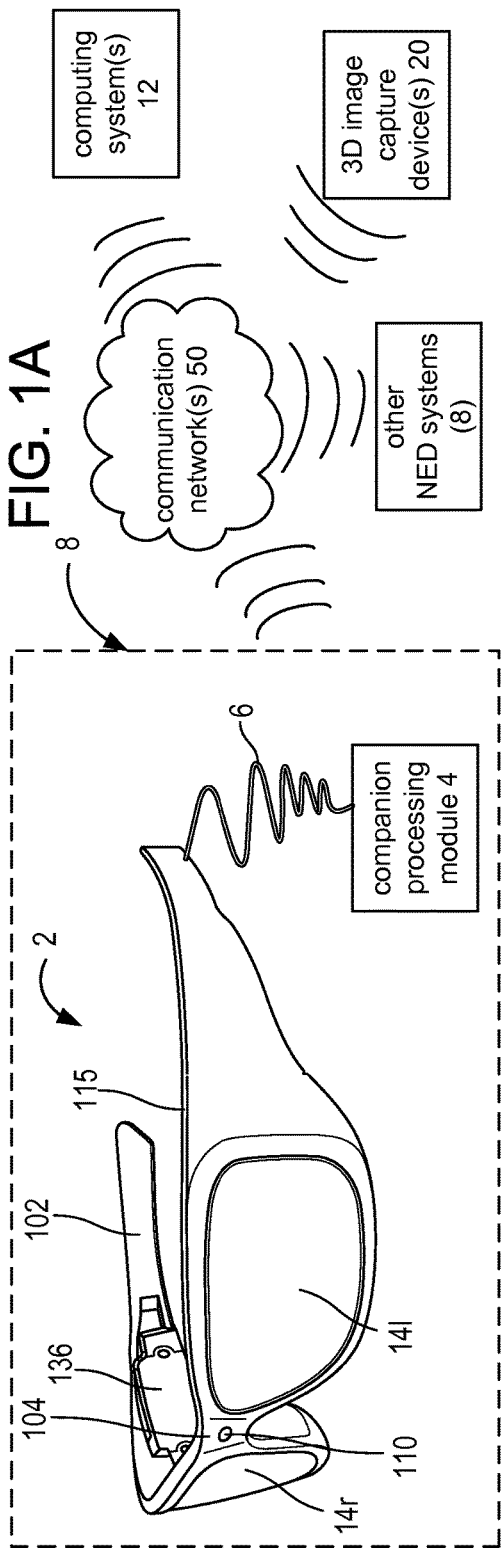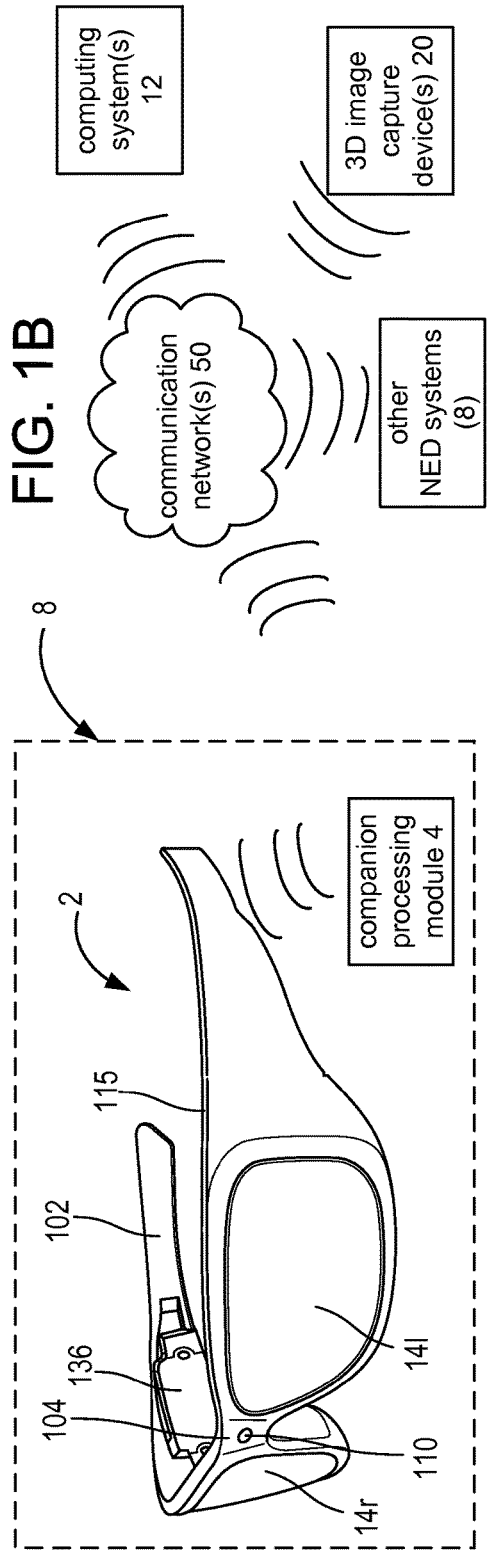

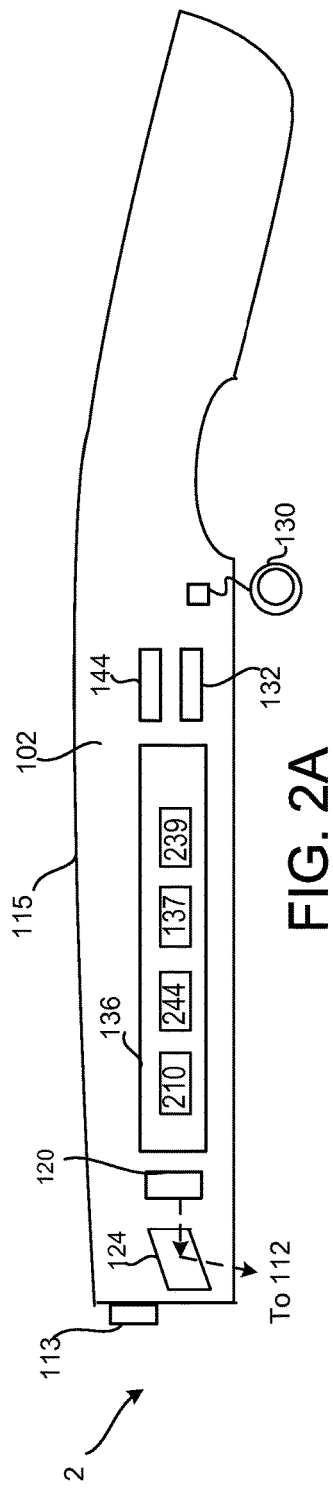
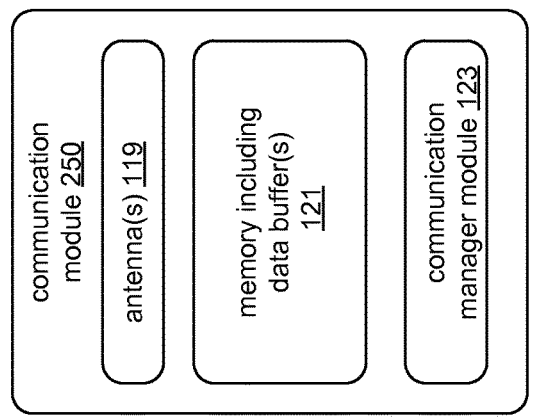
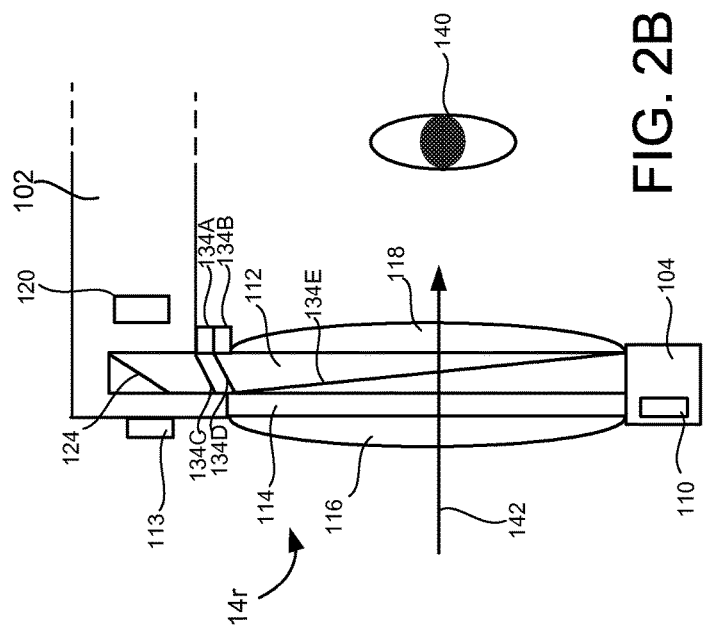

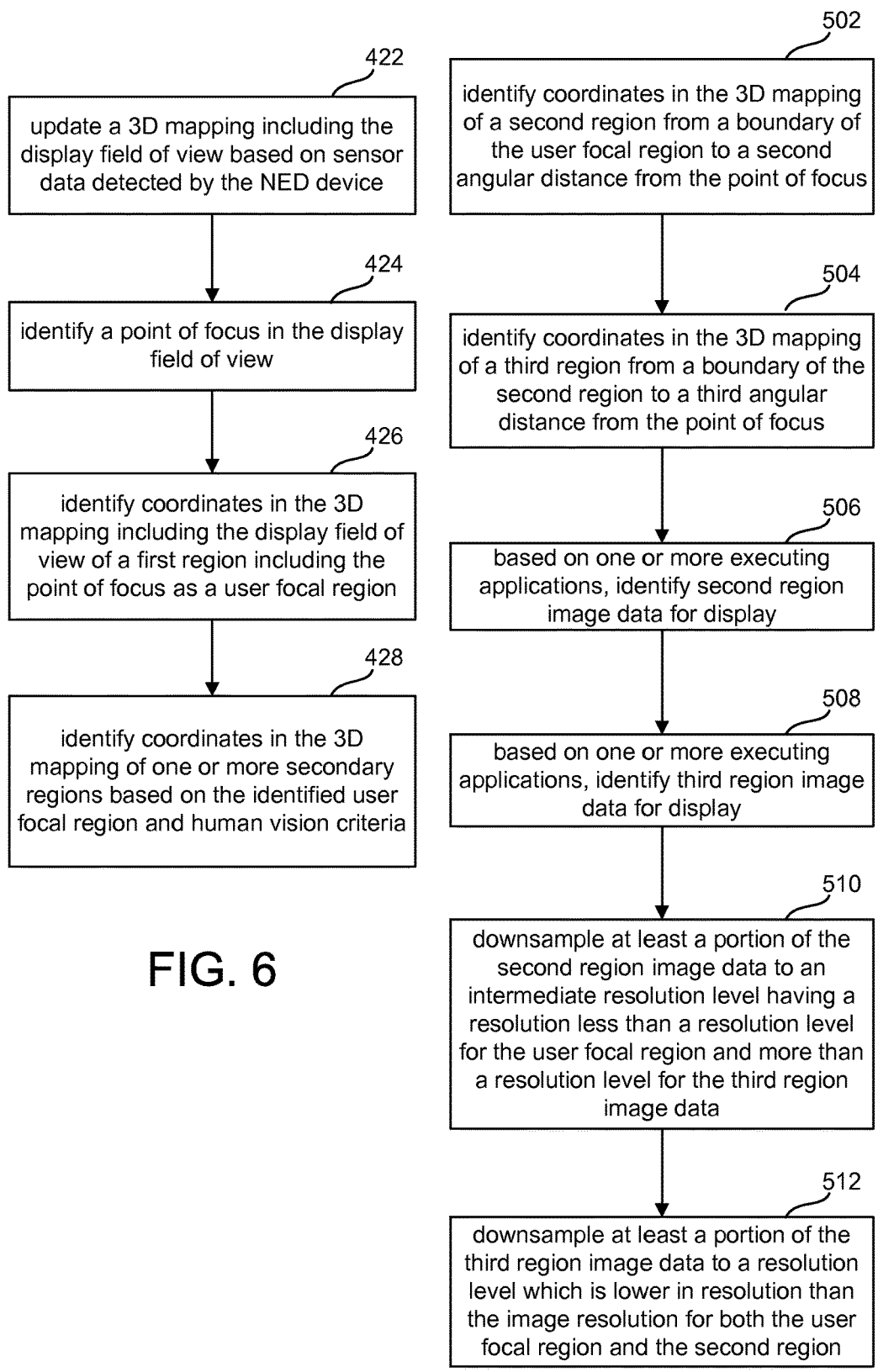

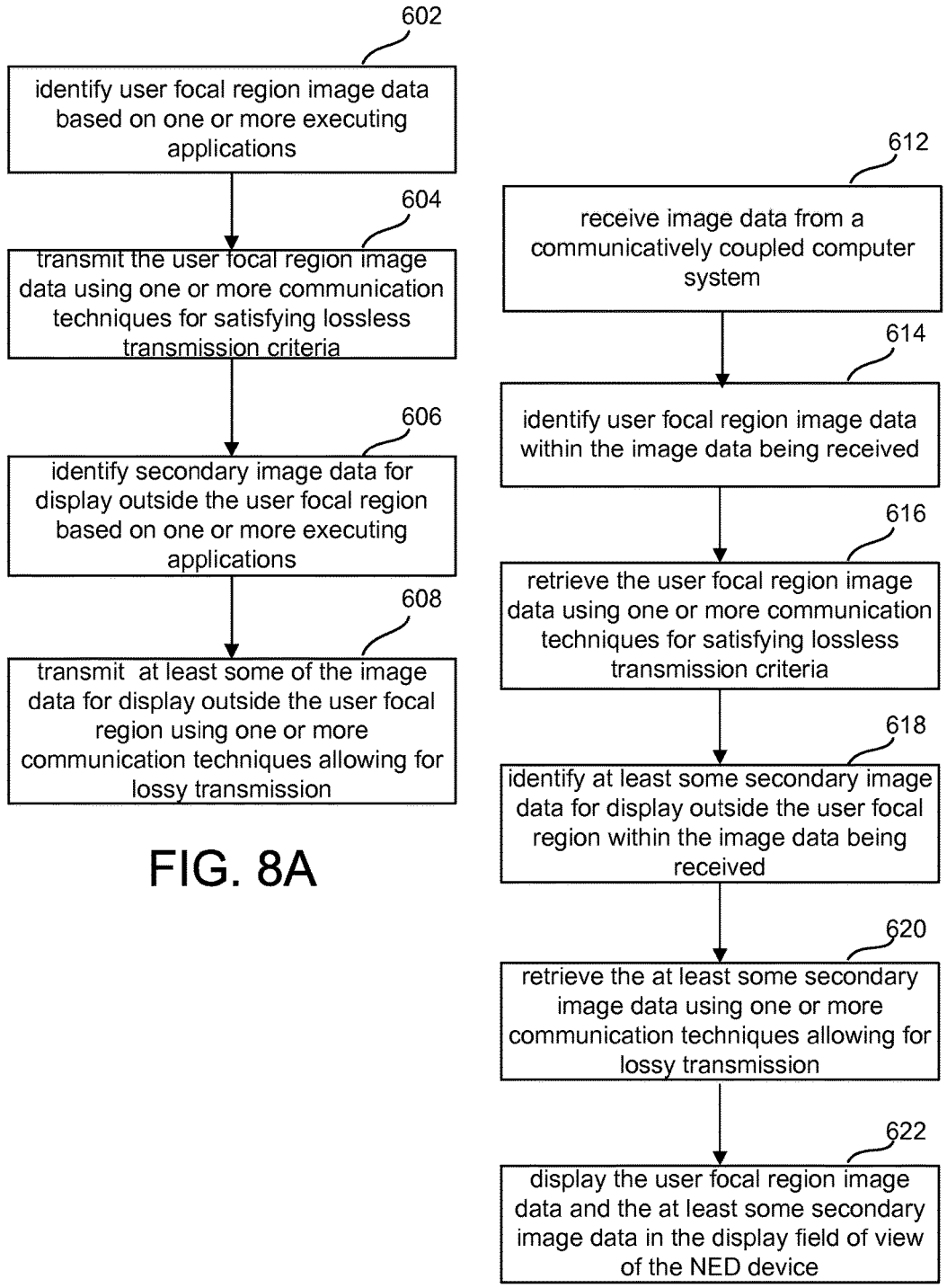

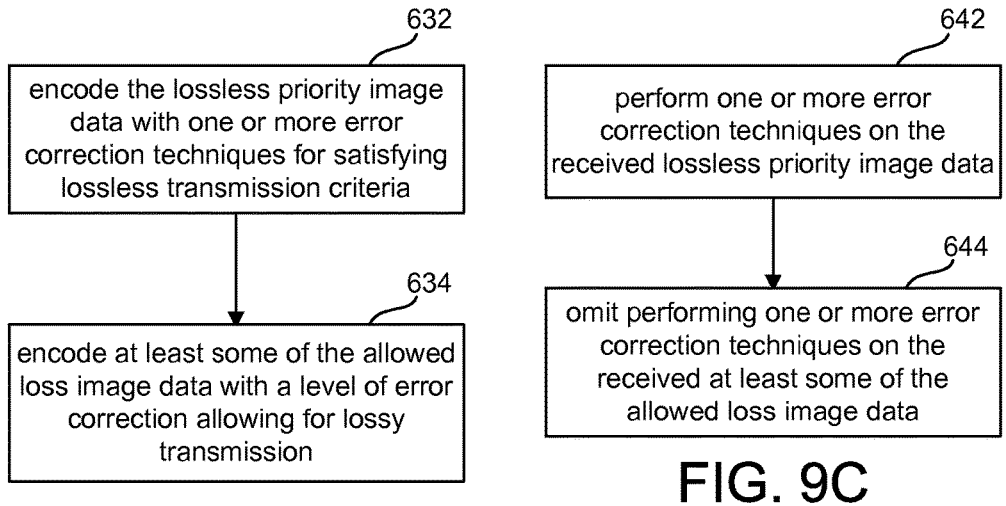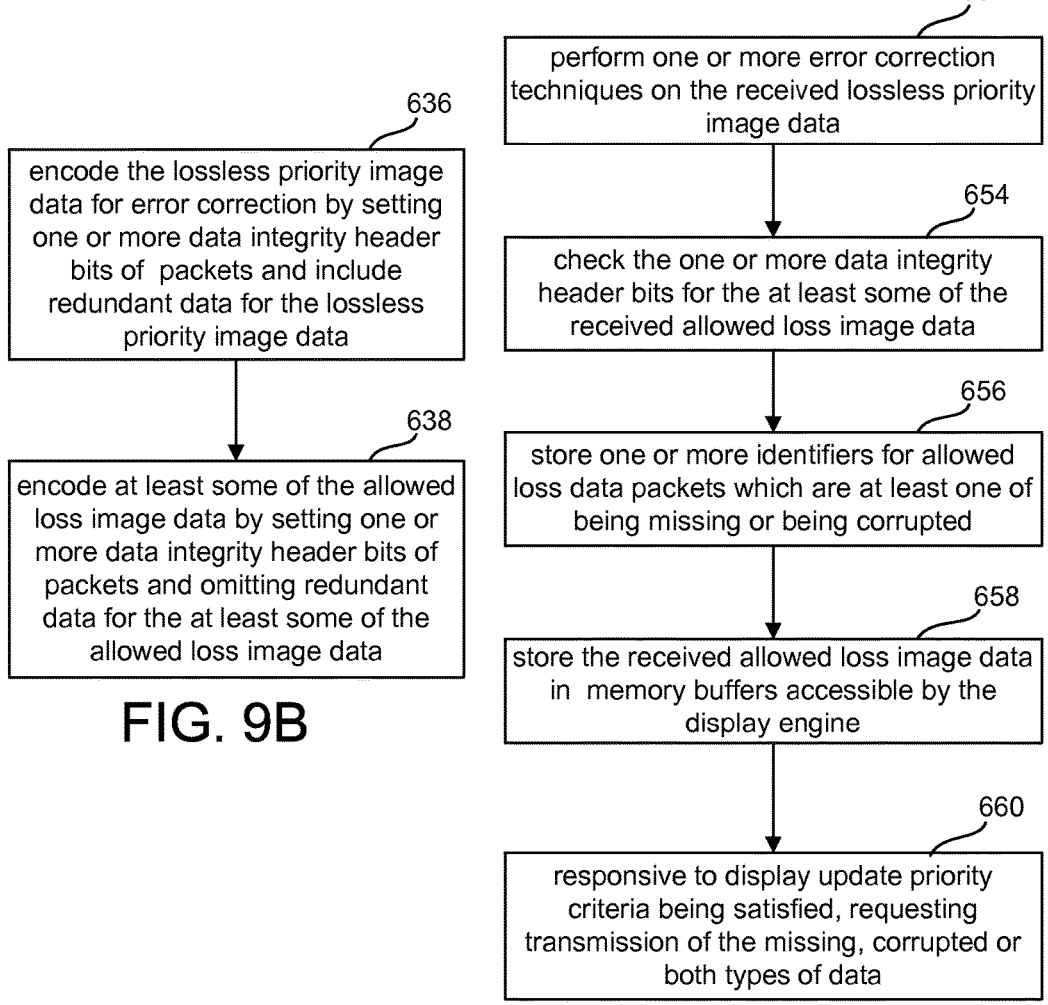

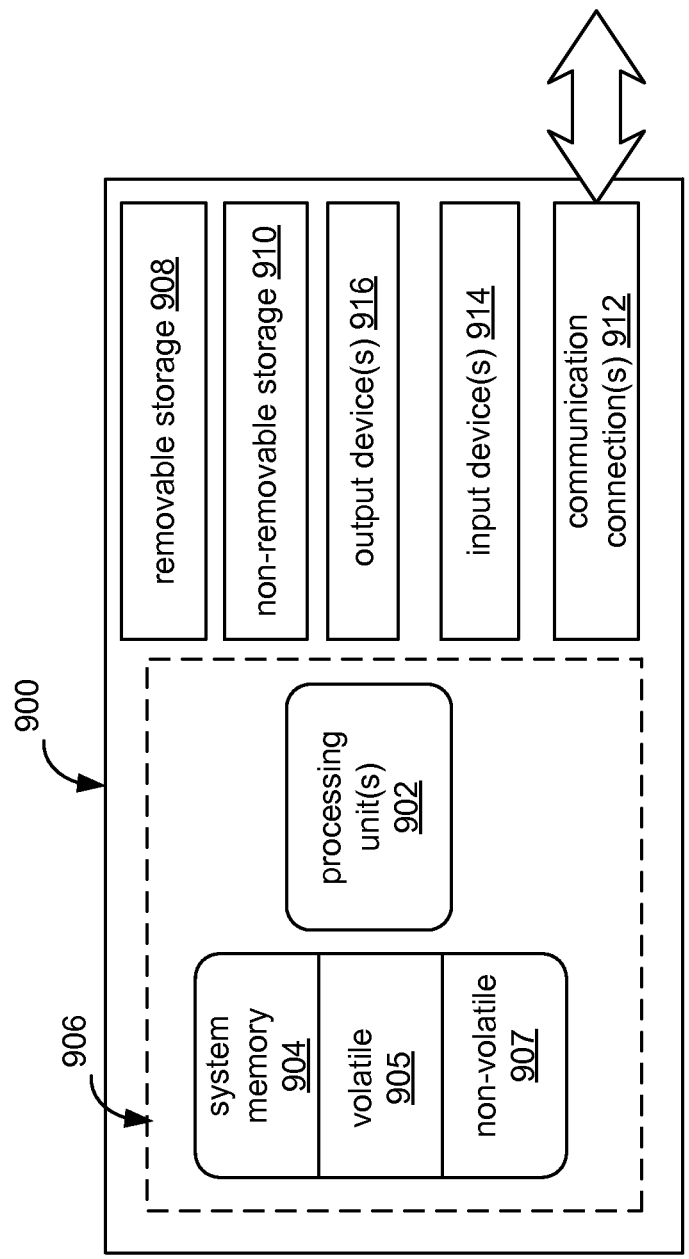

DISPLAY UPDATE TIME REDUCTION FOR A NEAR-EYE DISPLAY

BACKGROUND

A near-eye display (NED) device, such as a head mounted display (HMD) device, may be worn by a user for an augmented reality (AR) experience or a virtual reality (VR) experience. Many factors may effect a satisfying user experience of a NED user, but a user having to wait a noticeable time period for image data to be updated to reflect a response to a user action, poor image quality or a low battery life are typical factors for an unsatisfying user experience. Addressing factors like these typical factors for a consumer product, which is meant to be comfortable to wear, entails also considering practical factors like space, weight, power and cost (SWaP-C).

SUMMARY

The technology provides one or more embodiments of a method for reducing display update time for a NED device. An embodiment of the method comprises identifying a distance vector in a display field of view of the near-eye display device from a point of focus to image data for display in the display field of view. Based on the distance vector from the point of focus and low perception criteria, a computer system communicatively coupled to the NED device determines whether at least some of the image data to be displayed qualifies as lossless priority data which does not satisfy low perception criteria. The method embodiment further comprises, based on the distance vector from the point of focus, the computer system communicatively coupled to the NED device determines whether at least some of the image data to be displayed qualifies as allowed loss data which satisfies the low perception criteria. Responsive to at least some of the image data qualifying as allowed loss data, the computer system transmits to the NED device the allowed loss data using one or more communication techniques allowing for lossy transmission. Responsive to at least some of the image data qualifying as lossless priority data, the lossless priority image data is transmitted to the NED device by the computer system using one or more communication techniques satisfying lossless transmission criteria.

The technology provides one or more embodiments of a method for reducing display update time for a near-eye display (NED) device. An embodiment of the method comprises receiving user image data from a communicatively coupled computer system and identifying user focal region image data for display in a user focal region in a display field of view of the NED device within the image data being received. The user focal region image data is retrieved using one or more communication techniques for satisfying lossless transmission criteria. At least some secondary image data for display outside the user focal region is identified within the image data being received and is retrieved using one or more communication techniques allowing for lossy transmission. The user focal region image data and the at least some secondary image data are displayed in the display field of view of the NED device.

The technology provides one or more embodiments of a near-eye display (NED) device system. An embodiment of a NED device system comprises a near-eye display device including a near-eye support structure and a near-eye display (NED) supported by the near-eye support structure and having a display field of view. The NED system further comprises an image generation unit supported by the near-eye support structure which outputs image data which is optically coupled to the near-eye display (NED). The embodiment further comprises one or more processors communicatively coupled to the image generation unit for controlling display of image data. The one or more processors identify user focal region image data for display within the user focal region and identify secondary image data for display outside the user focal region based on one or more applications being executed by the NED device system. A first communication module is communicatively coupled to the one or more processors and is communicatively coupled over a communication medium to a computer system. The communication module retrieves from the computer system the user focal region image data using one or more communication techniques for satisfying lossless transmission criteria. The communication module retrieves at least some secondary image data from the computer system using one or more communication techniques allowing for lossy transmission.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1A is a block diagram depicting example components of one embodiment of a near-eye display (NED) device system.

FIG. 1B is a block diagram of another embodiment of the NED device system using wireless communication between a NED device and a companion processing module.

FIG. 2A is a side view of an eyeglass temple of a frame in an embodiment of the NED device having an optical see-through AR display, and the NED device being embodied as eyeglasses providing support for hardware and software components.

FIG. 2B is a top view of an embodiment of a display optical system of the embodiment of the NED device.

FIG. 2C is a block diagram of an embodiment of a communication module which may be used for receiving data by a NED system or transmitting data by another computer system to a NED system.

FIG. 6 is a flowchart of an embodiment of a method for identifying regions for displaying image data in a display field of view of the near-eye display (NED).

FIG. 7 is a flowchart of another embodiment of a method for determining secondary regions in the display field of view and image resolutions associated with them.

FIG. 8A is a flowchart of another embodiment of a method for reducing display update time for a NED device from the perspective of a transmitting computer system.

FIG. 8B is a flowchart of another embodiment of a method for reducing display update time for a NED device from the perspective of a receiving computer system of a NED device system.

FIG. 9A is a flowchart of a process example using different levels of error correction.

FIG. 9B is a flowchart illustrating some implementation examples for the communication techniques in FIG. 9A.

FIG. 9C is a flowchart illustrating some other examples of communication techniques which may be used in retrieving lossless priority image data and the allowed loss from received image data.

FIG. 9D is a flowchart illustrating another example of a communication technique for retrieving allowed loss image data from received image data.

FIG. 11 is a block diagram of one embodiment of a computing system that can be used to implement a network accessible computing system, a companion processing module or control circuitry of a near-eye display device.

DETAILED DESCRIPTION

Figure 1C:
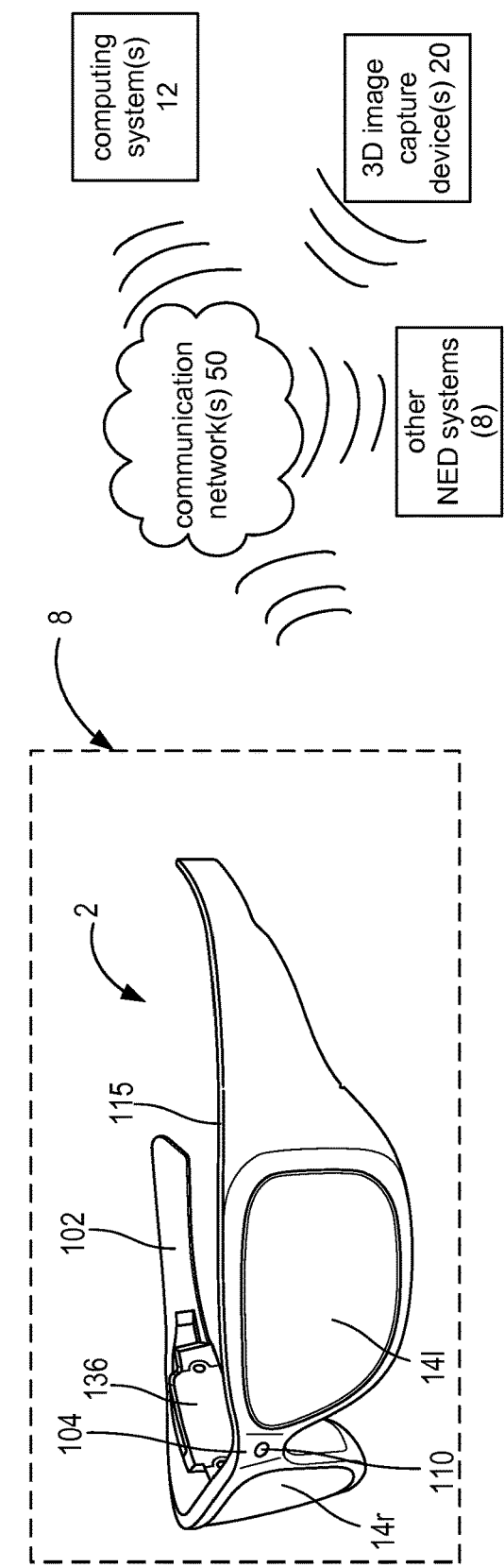
FIG. 1C is a block diagram depicting example components of another embodiment of a NED device system.

An example of a near-eye display (NED) device is a head mounted display (HMD) device. A NED device may be used for displaying image data of virtual objects in a field of view with real objects for an augmented or mixed reality experience. In a virtual reality system, a NED may display computer controlled imagery independently of a real world relationship. In another example, a near-eye display may be used in applications for enhancing sight like an infrared imaging device, e.g. a night vision device. To keep these experiences realistic, a display updates in real time with changes in a user's point of focus in a display field of view of the display and changes in image data based on executing applications. A user focal region surrounding the point of focus may be identified in the display field of view based on natural user input data such as eye tracking data or a pointing gesture identified in gesture data generated by a natural user input system of a NED system. In other examples, a user focal region may be predicted based on identifying a display location for image data based on an executing application as a user wearing the NED device is likely to look at updated image data in a field of view of the near-eye display.

Image data may be moving image data like video as well as still image data. Image data may also be three dimensional. An example of 3D image data is a hologram. Image data includes structure data which may be represented in a polygon mesh or as edge data. Additionally, image data includes color data including chroma or color saturation data and luminance data. Within each category of image data, bits are prioritized. For example, higher priority bits may be stored in a predetermined number of most significant bits (MSB) in a word format and lower priority bits may be stored in a predetermined number of least significant bits (LSB). The MSB bits of color words may represent a base color such as a green hue, and the LSB bits represent more saturation values distinguishing the green within a green family of colors. As data moves from the point of focus in the display field of view (e.g. user moves head or images change based on logic of application), the subtlety between greens represented by the LSB is no longer resolvable on the human eye or in a very small amount as green receptors have fallen off from distance from the fovea. Thus not representing the lower priority color bits does not diminish the user experience significantly.

Similarly, structure data representing a basic structure (e.g. a skeleton) may be treated as high priority data, while layers of details may be represented with decreasing priority in a bit structure in memory as the layers build on the basic structure. Luminance data may also be stored with bits descending in priority from the MSB of a word. As a distance from the point of focus increases, a computer system transmitting image data can relate the distance to a number of lower priority bits (e.g. a number of LSB) which may be dropped for transmission.

Other predetermined patterns of storing content to indicate priority of the different types of image data besides MSB to LSB may also be used. Additionally, there may be predetermined bounds on how much image data can be transmitted using communication techniques allowing for lossy transmission based on the distance from a point of focus. A gradual lessening of image quality is also desired, and also image quality, e.g. resolution, staying above the resolving power of the human eye. Data abruptly appearing or disappearing as it moves from a user focal region deviates from a natural sight experience and detracts from the user experience.

Embodiments of technology are described below which take advantage of human eye resolution and prioritizing image data with respect to its position in relation to the point of focus for lossless and lossy transmission. Additionally, some embodiments use different resolution levels for image data within the user focal region and image data outside the user focal region.

Lost data in transmission describes data which never arrives so it is missing or data corrupted en route so it is not the transmitted data. As there can always be some extremely small error in communication, lossless transmission criteria is described as a high probability, e.g. >99% or 99.999999% depending on the predetermined criteria for the system, that all the transmitted data is being accurately detected at the receiver. Another way to express a lossless transmission criteria is a bit error rate. In some examples, the stored lossless transmission criteria may identify different combinations of communication characteristics and communication techniques which satisfy an overall bit error rate. Some examples of such criteria are a type of communication medium, wired or wireless, range of transmission, a noise level range, and error correction rates associated with available types of error correction techniques, and one or more error rates associated with one or more available modulation techniques. Changing one type of criteria can change criteria values for the other types of criteria making up lossless transmission criteria. Allowing for lossy transmission by not meeting the lossless transmission criteria may not result in lost data, but the probability of losing data may be unacceptable, e.g. 80% of the data accurately detected at the receiver, for high priority data which a user is focusing on.

FIG. 1A is a block diagram depicting example components of one embodiment of a near-eye display (NED) device system. In the illustrated embodiment, the system includes a near-eye display (NED) device as a head mounted display (HMD) device 2 and communicatively coupled via a wire 6 to another computer system identified as a companion processing module 4. In many embodiments, the companion processing module 4 is capable of establishing a direct one-to-one communication link with a communication module on the NED device. The link may be short range, e.g. within less than ten feet. A direct link does not depend on an intervening communication transfer point such as a network router or cellular station. An example of a direct link is a wire or a wireless direct link like an infrared link over a wireless communication medium of air. Besides a direct communication link, the NED device 2 and companion processing module 4 may also communicate via network protocols like other networked devices. In many embodiments, the companion processing module 4 may be worn or held by the user, some examples of which are a wrist based module or a mobile device like a smartphone or tablet. The companion processing module accompanies the user when he or she is wearing the NED display and may provide auxiliary services, for example acting as an auxiliary user input device for the NED device.

FIG. 1B is a block diagram of another embodiment of the NED device system using wireless communication between a NED device 2 and a companion processing module 4. FIG. 1C is a block diagram depicting example components of another embodiment of a NED device system without a companion processing module 4 in which the NED device system 8 is incorporated on the near-eye display device 2.

In these embodiments, NED device 2 is in the shape of eyeglasses in a frame 115, with a respective display optical system 14 positioned at the front of the NED device to be seen through by each eye when the NED is worn by a user. In this embodiment, each display optical system 14 uses a projection display in which image data is projected into a user's eye to generate a display of the image data so that the image data appears to the user at a location in a three dimensional field of view in front of the user. For example, a user may be playing a shoot down enemy helicopter game in an optical see-through mode in his living room. An image of a helicopter appears to the user to be flying over a chair in his living room, not between lenses 116 and 118 as a user cannot focus on image data that close to the human eye. The display generating the image is separate from where the image is seen. Each display optical system 14 is also referred to as a display, and the two display optical systems 14 together may also be referred to as a display.

In some embodiments, the display may be displaying image data in a virtual reality (VR) context. For example, the image data is of people and things which move independently from the wearer's real world environment, and light from the user's real world environment is blocked by the display, for example via an opacity filter. In other embodiments, the display may be used for augmented reality (AR). A user using a near-eye, AR display sees virtual objects displayed with real objects in real time. In particular, a user wearing an optical see-through, augmented reality display device actually sees with his or her natural sight a real object, which is not occluded by image data of a virtual object or virtual effects, in a display field of view of the see-through display, hence the names see-through display and optical see-through display. For other types of augmented reality displays like video-see displays, sometimes referred to as video see-through displays, or a display operating in a video-see mode, the display is not really see-through because the user does not see real objects with his natural sight, but sees displayed image data of unoccluded real objects as they would appear with natural sight as well as image data of virtual objects and virtual effects. References to a see-through display below are referring to an optical see-through display.

In these embodiments, frame 115 provides a convenient eyeglass frame as a near-eye support structure for holding elements of the NED device 2 in place as well as a conduit for electrical connections. Some other examples of a near-eye support structure are a visor frame or a goggles support. The frame 115 includes a nose bridge 104 with a microphone 110 for recording sounds and transmitting audio data to control circuitry 136. A temple or side arm 102 of the frame rests on each of a user's ears, and in this example, the right side arm 102r is illustrated as including control circuitry 136 for the NED device 2.

The companion processing module 4 may take various embodiments. In some embodiments, companion processing module 4 is in a portable form which may be worn on the user's body, e.g. a wrist, or be a separate portable computer system like a mobile device (e.g. smartphone, tablet, laptop). As illustrated in FIGS. 1A and 1B, the companion processing module 4 may communicate wired or wirelessly (e.g., WiFi, Bluetooth, infrared, an infrared personal area network, RFID transmission, wireless Universal Serial Bus (WUSB), cellular, 3G, 4G or other wireless communication means) over one or more communication networks 50 to one or more network accessible computer systems 12, whether located nearby or at a remote location, other near-eye display device systems 8 in a location or environment, for example as part of peer-to-peer communication, and if available, one or more 3D image capture devices 20 in the environment. In other embodiments, the functionality of the companion processing module 4 may be integrated in software and hardware components of the display device 2 (see FIG. 1C). Some examples of hardware components of the companion processing module 4 are shown in FIG. 11.

One or more network accessible computer system(s) 12 may be leveraged for processing power and remote data access. An example of hardware components of a computer system 12 is shown in FIG. 11. The complexity and number of components may vary considerably for different embodiments of the computer system 12 and the companion processing module 4.

An application may be executing on a computer system 12 which interacts with or performs processing for an application executing on one or more processors in the near-eye display device system 8. For example, a 3D mapping application may be executing on the one or more computers systems 12 and the user's near-eye display device system 8. In some embodiments, the application instances may perform in a master and client role in which a client copy is executing on one or more processors within the near-eye display device system 8 and performs 3D mapping of its display field of view, receives updates of the 3D mapping from the computer system(s) 12 including updates of objects in its view from the master 3D mapping application and sends image data, and depth and object identification data, if available, back to the master copy. Additionally, in some embodiments, 3D mapping application instances executing on different near-eye display device systems 8 in the same environment share data updates in real time, for example real object identifications in a peer-to-peer configuration between systems 8.

The term "display field of view" refers to a field of view of a display of the NED device system. In other words, the display field of view approximates a user field of view as seen from a user perspective. However, while the field of view for natural human sight may extend beyond 180 degrees centered between a user's eyes and including peripheral vision, display fields of view for NEDs are typically more limited. For example, a NED device display field of view may approximate sixty degrees of a center portion of the human field of view. In many embodiments, the display field of view for each type of display, may be mapped by a view dependent coordinate system, having orthogonal X, Y and Z axes in which a Z-axis represents a depth position from one or more reference points. For example, the display may use a reference point for each display 14l, 14r, such as the intersection point of an optical axis (see 142 in FIG. 2B below) for each display. Additionally, the display field of view may also be mapped in view independent coordinates for an environment which are useful for identifying objects and retrieving related image data which is then oriented for display in the view dependent coordinates to approximate the user perspective of the image data.

In the illustrated embodiment of FIG. 1, the one or more computer systems 12 and the portable near-eye display device system 8 also have network access to one or more 3D image capture devices 20 which may be, for example, one or more cameras that visually monitor one or more users and the surrounding space such that gestures and movements performed by the one or more users, as well as the structure of the surrounding space including surfaces and objects, may be captured, analyzed, and tracked. Image data, and depth data if captured by the one or more 3D image capture devices 20 may supplement data captured by one or more capture devices 113 of one or more near-eye display device systems 8 in a location. The one or more capture devices 20 may be one or more depth cameras positioned in a user environment.

FIG. 1C is a block diagram depicting example components of another embodiment of a NED device system without a companion processing module 4 in which the NED device system 8 is incorporated on the near-eye display device 2. In this embodiment, the control circuitry 136 of the display device 2 incorporates the functionality which a companion processing module 4 provides in FIG. 1A and communicates wirelessly via a communication module (see communication module 137 in FIG. 2A) over a communication network 50 to one or more computer systems 12 whether located nearby or at a remote location, other NED systems 8 in a location or environment and, if available, a 3D image capture device 20 in the environment.

FIG. 2A is a side view of an eyeglass temple of a frame in an embodiment of the NED device having an optical see-through AR display, and the NED device being embodied as eyeglasses providing support for hardware and software components. At the front of frame 115 is depicted one of at least two physical environment facing image capture devices 113, e.g. cameras, that can capture image data like video and still images, typically in color, of the real world to map real objects at least in the display field of view of the see-through display, and hence, in the field of view of the user. In some embodiments, the capture devices may be sensitive to infrared (IR) light or other types of light outside the visible light spectrum like ultraviolet. Images can be generated based on the captured data for display by applications like a night vision application.

The capture devices 113 are also referred to as outward facing capture devices meaning facing outward from the user's head. Optionally, there may be outward facing side capture devices which also capture image data of real objects in the user's environment which can be used for 3D mapping. The capture devices 113 are also referred to as outward facing capture devices meaning facing outward from the user's head. The illustrated capture device is a front facing capture device which is calibrated with respect to a reference point of its respective display optical system 14. One example of such a reference point is an optical axis (see 142 in FIG. 2B) of its respective display optical system 14. The calibration allows the display field of view of the display optical systems 14 to be determined from the data captured by the capture devices 113.

In some examples, the image capture devices 113 may also be depth sensitive, for example, they may be depth sensitive cameras which transmit and detect infrared light from which depth data may be determined. In other examples, a separate depth sensor (not shown) on the front of the frame 115, or its sides if side capture devices are in use, may also capture and provide depth data to objects and other surfaces in the display field of view. The depth data and image data form a depth map of the captured field of view of the image capture devices 113 which are calibrated to include the display field of view. A three dimensional (3D) mapping of a display field of view can be generated based on the depth map.

In some embodiments, the physical environment facing capture devices 113 provide overlapping image data from which depth information for objects in the image data may be determined based on stereopsis. Parallax and contrasting features such as color may also be used to resolve relative positions of real objects.

Control circuitry 136 provides various electronics that support the other components of head mounted display device 2. In this example, the right side arm 102 includes control circuitry 136 for the display device 2 which includes a processing unit 210, a memory 244 accessible to the processing unit 210 for storing processor readable instructions and data, a communication module 137 communicatively coupled to the processing unit 210, and a power supply 239 providing power for the components of the control circuitry 136 and the other components of the display device 2 like the capture devices 113, the microphone 110 and the sensor units discussed below. The processing unit 210 may comprise one or more processors including a central processing unit (CPU) and a graphics processing unit (GPU), particularly in embodiments without a separate companion processing module 4 which contains at least one graphics processing unit (GPU).

Inside, or mounted to a side arm 102, are an earphone of a set of earphones 130 as an example of an audio output device, an inertial sensing unit 132 including one or more inertial sensors, and a location sensing unit 144 including one or more location or proximity sensors, some examples of which are a GPS transceiver, an infrared (IR) transceiver, or a radio frequency transceiver for processing RFID data. In one embodiment, inertial sensing unit 132 includes a three axis magnetometer, a three axis gyro, and a three axis accelerometer as inertial sensors. The inertial sensors are for sensing position, orientation, and sudden accelerations of head mounted display device 2. From these sensed movements, head position, and thus orientation of the display device, may also be determined which indicate changes in the user perspective and the display field of view for which image data is updated to track with the user perspective. In this embodiment, each of the units or devices processing an analog signal in its operation include control circuitry which interfaces digitally with the digital processing unit 210 and memory 244 and which produces or converts analog signals, or both produces and converts analog signals, for its respective device. Some examples of devices which process analog signals are the location and inertial sensing units, earphones 130 as well as the microphone 110, capture devices 113 and a respective IR illumination source 134A and respective IR detector 134B for each eye's display optical system 14l and 14r.

The tracking of the user's head position and the 3D mapping of at least the display field of view is used for determining what image data to represent to a user in the different experiences like augmented reality, virtual reality and night vision by one or more processors of the NED device system 8 or a network accessible computer system 12 or a combination of these.

In this embodiment, the image generation unit 120 can display a virtual object to appear at a designated depth location in a display field of view to provide a realistic, in-focus three dimensional display of a virtual object which can interact with one or more real objects. In some examples, rapid display of multiple images or a composite image of the in-focus portions of the images of virtual features may be used for causing the displayed virtual data to appear in different focal regions.

In the illustrated embodiment of FIG. 2A, the image generation unit 120 includes a microdisplay and coupling optics, like a lens system. In this example, image data output by the microdisplay is directed to a reflecting surface or element 124. The reflecting surface or element 124 optically couples the light from the image generation unit 120 into a display unit 112 (see FIG. 2B), which directs the light representing the image into a user's eye when the device 2 is worn by a user.

FIG. 2B is a top view of an embodiment of a display optical system of a NED device. In order to show the components of the display optical system 14, in this case 14r for the right eye, a portion of the frame 115 surrounding the display optical system is not depicted. In this embodiment, the displays 14l and 14r are optical see-through displays, and each display includes a display unit 112 illustrated between two optional see-through lenses 116 and 118 and including a representative reflecting element 134E representing the one or more optical elements like a half mirror, grating, and other optical elements which may be used for directing light from the image generation unit 120 towards a user eye 140. Arrow 142 represents an optical axis of the display optical system 14r. An example of a display unit 112 for an optical see-through NED includes a light guide optical element. An example of a light guide optical element is a planar waveguide.

In an optical see-through, augmented reality embodiment, display unit 112 is see-through as well so that it may allow light from in front of the near-eye display (NED) device 2 to be received by eye 140, thereby allowing the user to have an actual direct view of the space in front of NED device 2 in addition to seeing an image of a virtual feature from the image generation unit 120. The use of the term "actual direct view" refers to the ability to see real world objects directly with the human eye, rather than seeing created image representations of the objects. For example, looking through glass at a room allows a user to have an actual direct view of the room, while viewing a video of a room on a television is not an actual direct view of the room.

In some embodiments, each display unit 112 may also optionally include an integrated eye tracking system. For example, an infrared (IR) illumination source may be optically coupled into each display unit 112. The one or more optical elements which direct visible light towards the eye may also direct the IR illumination towards the eye and be bidirectional in the sense of being able to direct IR reflections from the eye to an IR sensor such as an IR camera. A pupil position may be identified for each eye from the respective IR sensor data captured, and based on a model of the eye, e.g. the Gullstrand eye model, and the pupil position, a gaze line for each eye may be determined by software extending from an approximated fovea position. A point of gaze in the display field of view can be identified. An object at the point of gaze may be identified as an object of focus. A user focal region around the point of gaze may be identified based human vision parameters or based on a predetermined distance previously determined based on human vision parameters.

In this embodiment, display unit 112 includes a planar waveguide which acts as part of the display and also integrates eye tracking. The representative reflecting element 134E represents the one or more optical elements like mirrors, gratings, and other optical elements which direct visible light representing an image from the planar waveguide towards the user eye 140. In this embodiment, representative reflecting element 134E also performs bidirectional reflection of infrared light as part of the eye tracking system. Infrared illumination and reflections, also traverse the planar waveguide for an eye tracking system 134 for tracking the position and movement of the user's eye, typically the user's pupil. Eye movements may also include blinks. The eye tracking system 134 comprises an eye tracking IR illumination source 134A (an infrared light emitting diode (LED) or a laser (e.g. VCSEL)) and an eye tracking IR sensor 134B (e.g. IR camera, arrangement of IR photodetectors,). Wavelength selective filters 134C and 134D with representative reflecting element 134E implement bidirectional infrared (IR) filtering which directs IR illumination towards the eye 140, preferably centered about the optical axis 142 and receives IR reflections from the user eye 140, preferably including reflections captured about the optical axis 142, which are directed from the waveguide to an IR sensor 134B.

In other integrated eye tracking display embodiments, a prism, for example a free form prism forms part of the display unit 12. Light representing image data from the image generation unit 120 and the eye tracking IR illumination source 134A are optically coupled into the prism. An example of a prism is a wedge optic. Reflections from the eye are captured via the prism and are optically coupled to an eye tracking IR sensor 134B.

In other embodiments, the eye tracking unit optics are not integrated with the display optics. For more examples of eye tracking systems for HMD devices, see U.S. Pat. No. 7,401,920, entitled "Head Mounted Eye Tracking and Display System", issued Jul. 22, 2008 to Kranz et al., see U.S. patent application Ser. No. 13/221,739, Lewis et al., entitled "Gaze Detection in a See-Through, Near-Eye, Mixed Reality Display," filed Aug. 30, 2011, and see U.S. patent application Ser. No. 13/245,700, Bohn, entitled "Integrated Eye Tracking and Display System," filed Sep. 26, 2011, all of which are incorporated herein by reference.

Opacity filter 114, which is aligned with light guide optical element 112, enhances contrast of image data against a real world view by selectively blocking natural light from passing through display unit 112. The opacity filter assists the image of a virtual object to appear more realistic and represent a full range of colors and intensities. In this embodiment, electrical control circuitry for the opacity filter, not shown, receives instructions from the control circuitry 136 via electrical connections routed through the frame. More details of an opacity filter are provided in U.S. patent application Ser. No. 12/887,426, "Opacity Filter For See-Through Mounted Display," filed on Sep. 21, 2010, incorporated herein by reference in its entirety.

Again, FIGS. 2A and 2B show half of the head mounted display device 2. For the illustrated embodiment, a full head mounted display device 2 may include another display optical system 14 with another set of optional see-through lenses 116 and 118, another opacity filter 114, another light guide optical element 112, as well as another image generation unit 120, another of outward facing capture devices 113, eye tracking system 134, and another of the earphones 130. In some embodiments, there may be a continuous display viewed by both eyes, rather than a display optical system for each eye. In some embodiments, a single image generation unit 120 may be optically coupled to a continuous display viewed by both eyes or be optically coupled to separate displays for the eyes. Additional details of a head mounted personal A/V apparatus are illustrated in U.S. patent application Ser. No. 12/905,952 entitled Fusing Virtual Content Into Real Content, Filed Oct. 15, 2010, fully incorporated herein by reference.

FIG. 2C is a block diagram of an embodiment of a communication module which may be used for receiving data by a NED system or transmitting data by another computer system to a NED system. Depending on the communication medium being wired or wireless, the communication module 250 may be embodied for processing wired communication or wireless communication, and in some cases both depending on the antennas and interface circuitry included. The communication module 250 provides functionality for communicatively coupling and transferring data to and from a computer system of the NED system such as the computer system embodied in the control circuitry 136 or a computer system embodied in the companion processing module 4. For example, communication module 137 may embody the functionality of the embodiment of communication module 250. A computer system like another NED system 8 or a network accessible computer system 12 may also include a communication module like the embodiment in FIG. 2C. Some examples of such functionality include communication techniques like encoding data for transmission as well as decoding received data in accordance with one or more standards or protocols and error correction techniques, modulating and demodulating data onto and off a signal, and communication management activities like negotiating channels and resolving collisions.

The illustrated communication module embodiment comprises a communication manager module 123, one or more antennas 119 and memory 121 including one or more data buffers for incoming and outgoing data. The communication manager module 123 communicates with one or more processors of the NED system 8 for identifying receipt and transmission of image data. Lossless transmission criteria may be stored in memory 121 for the communication module 250 or downloaded from a communicatively coupled processor. The communication manager module 123 may comprise one or more encoders and one or more decoders and provides instructions to the encoders and decoders based on whether the image data is being processed for lossless transmission or transmission allowing loss. For example, the instructions may indicate whether to set certain header bits for error correction techniques like a forward error correction (FEC) code and include redundant data or not. The communication manager module 123 provides instructions to a modulator and demodulator as bit density may vary based on a distance of the image data from the point of focus. For example, for image data for display in a user focal region, hereafter referred to as user focal region image data, a constellation encoding scheme may be assigned with a bit-to-symbol density selected for providing an estimated bit error rate based on noise characteristics of one or more communication channels which bit error rate satisfies lossless transmission criteria.

Different channel conditions may affect a bit error rate which may be measured with test patterns by the manager 123 or estimated based on detected noise levels. One or more noise reduction, error correction and modulation techniques may be selected and applied by the communication manager 123 or selected by one or more processors of the NED system 8 (e.g. a processing unit like 902 for the companion processing module) which selection is communicated to and applied by the communication manager 123 for bring the bit error rate within the lossless transmission criteria. Different lossless transmission criteria may apply for different communication mediums. A wired connection is a type of communication medium. A wireless connection is a type of communication medium. There are different types of wired connections, e.g. different cable types like twisted pair or HDMI, and there are different wireless protocols which may be applied for a wireless connection like those in the IEEE 802.11 family.

The technology takes advantage of resolution limitations of natural human sight to cut down on an amount of data transferred and saving time avoiding communication techniques which ensure lossless transmission for image data which is unlikely to be perceived by a human eye. A human eye "sees" by reflections of light in a certain wavelength band being received on the human retina. At the center of the retina is the fovea. Objects which reflect light which reaches the fovea are seen with the highest sharpness or clarity of detail for human sight. This type of clear vision is referred to as foveal vision. In the typical case of using both eyes, a point of gaze or focus or an object of focus for human eyes is one for which light is reflected back to each eye's center of its fovea. An example of an object of focus is a word on a book page. When a reader looks at a page, generally a number of the words around the word of focus appear clear as well. The number of words are in a user focal region which includes the point of gaze and in which objects appear sharp or clear, sometimes referred to as with single vision.

A volume known as the Panum's fusional is a volume in which the human eyes see objects with single vision. Humans have binocular vision or stereoptic vision. Each eye produces an image from a different point of view. Only in this small volume of the Panum's fusional area do humans see an object with single vision. This is generally what is meant when an object is said to be in focus. Outside this area, objects can appear blurry or even appear as double images. Within the center of the Panum's fusional area is a Horopter which includes the focal point or point of gaze of the user's eyes. When a user is focused on a point in space, that point in space is located on a curved line. Objects on this curved line in space fall on the retinas of the eyes in the fovea. The curved line is sometimes referred to as the horizontal horopter. There is also a vertical horopter which is a line through the curved line which tilts away from the eyes above the point of gaze and towards the eyes below the point of gaze on the curve. The term Horopter as used hereafter refers to both of its vertical and horizontal components.

As the eyeball is often modeled as a sphere or spherical shape, e.g. Gullstrand model, the size of areas on the retina are often discussed in degrees or radians or angular measurements. The fovea centralis, referred to here after as the fovea, is at the center of the retina and is less than two degrees, e.g. 1.2 degrees. However, the fovea has the highest density of cones which allow humans to perceive a wider range of colors than other living things and more accurate perception of detail including depth and changes in detail than rods provide. Rods exist outside the fovea on the retina and vastly outnumber the cones on the retina. Rods capture light from a wider field of view of the retina, however their sensitivity to visible light is significantly less than for cones. However, rods are very sensitive to motion. When one sees something "out of the corner of my eye", that is due to rod sensitivity. To sum up, cones provide a higher resolution image to our brains than our rods do. From the fovea at the center of the retina, the amount of cones reduces, and the number of rods increases resulting in human perception of detail falling off with angular distance from the center of the fovea for each eye. For example, close to the fovea, the angular resolution of the eye is around 1 arcmin as mentioned above. About eight degrees off the fovea center, the eye's natural angular resolution drops by half falling below 2 arcmin. At about fifteen degrees off the fovea center, the eye's resolution falls by another half, e.g. a quarter of the resolution of the fovea.

The resolving power of the human eye for light reaching its fovea is approximately 1 arcmin. For example, the 1 arcmin resolution of the fovea allows a user to read text on a page. The following example is presented to give a sense of the bandwidth used to achieve 1 arcmin resolution across a display field of view of 60×60 degrees. Dual 1080p video streams are transmitted at 60 frames per second (fps) and 24 bits per pixel (bpp) using 5.6 Gigabits per second (Gbps) of communication bandwidth. This may be over the capabilities of USB 3.0, a very new and high-speed communication standard. A stunning 3600×3600 pixel resolution would be used with an accompanying data transfer rate of 34 Gbps to cover the 60×60 degree display field of view at a 1 arcmin resolution. The challenge to transmit more than 5 Gbps of data over a single copper cable pair is significant.

The following flowcharts provide embodiments of methods which reduce display update time by determining how to transmit and process received image data based on the distance in the display field of view the image data is to be displayed from a point of focus. In embodiments described in FIGS. 8A and 8B, the distance can be determined in terms of regions centered about the point of focus in which the image data is to be displayed. Other approaches allow transmission quality criteria to be lessened in a more gradual or continual manner.

Figure 3A:
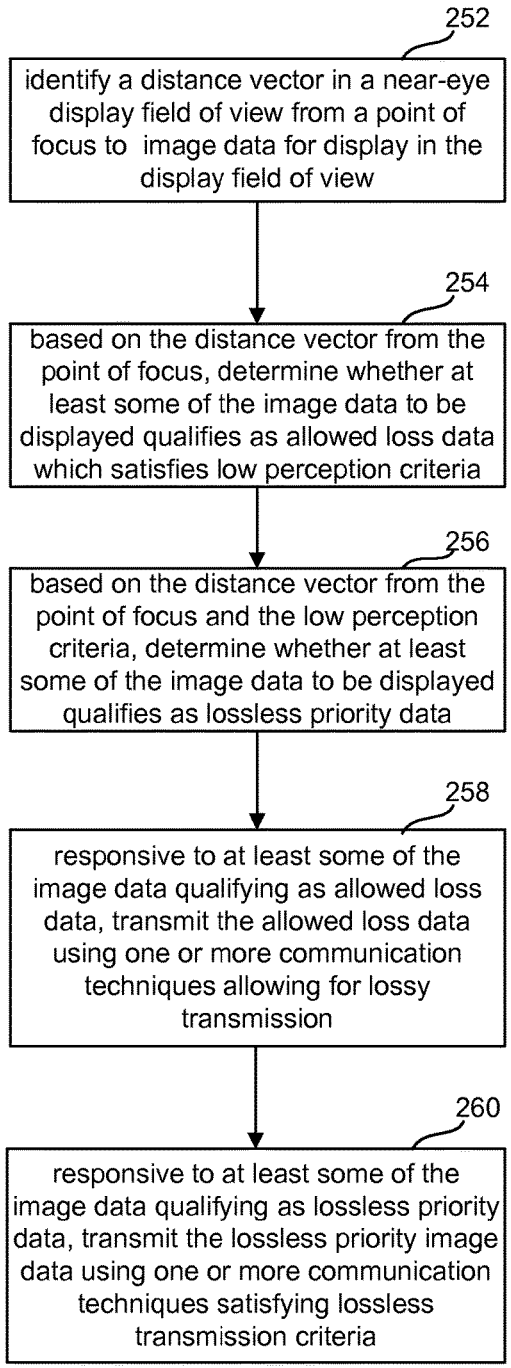
FIG. 3A is a flowchart of an embodiment of a method for reducing display update time for a NED device from the perspective of a transmitting computer system.

FIG. 3A is a flowchart of an embodiment of a method for reducing display update time for a NED device from the perspective of a transmitting computer system. An example of a transmitting computer system communicatively coupled to the NED device is a computer system embodied in the companion processing module 4. In another example, the transmitting computer system may be remote from the NED device system 8, such as the illustrated network accessible computer system 12 (e.g. a game console or computer system of a cloud based gaming service). In step 252, a computer system communicatively coupled to the NED identifies a distance vector in a near-eye display field of view from a point of focus to image data for display in the display field of view.

The distance may be measured with respect to each of a subdivision of the image data. For example, the distance may be measured from a center of an image data segment projected by a particular display area like a picture element, pixel of the display unit 112. In another example, the distance may be with respect to a center of an object represented by image data, e.g. a center of a displayed basketball in a coordinates of a 3D mapping of a basketball court scene. In step 254 based on the distance from the point of focus, the transmitting computer system determines whether at least some of the image data to be displayed qualifies as allowed loss data which satisfies low perception criteria. In step 256 based on the distance from the point of focus and the low perception criteria, the transmitting computer system determines whether at least some of the image data to be displayed qualifies as lossless priority data which does not satisfy low perception criteria. In some examples, the distance vector is used to relate the position of the image data in the display field of view back to an intersection point with an approximated retina location (e.g. 143*l* and 143*r*) for each eye. An angular distance vector from the intersection point to an approximated fovea center may be determined for better relating to low perception criteria.

Low perception criteria is predetermined and is based on established human vision criteria for resolving color, structure and luminance. For example, such human vision criteria may be based on models of cone and rod distribution on a human retina. An example of low perception criteria is that light from image data projected in a display field of view would fall within a certain angular distance on the retina from the fovea The distance part from the point of focus may be significantly weighted in determining whether low perception criteria is satisfied. The direction may also receive a significant weighting as the image data may be near the edge of the display field of view. Generally, the closer the image data to the point of focus, the more likely it qualifies as lossless priority image data, and the farther the image data is from the point of focus, the more likely it qualifies as allowed loss image data. Generally, more data within an image focal region surrounding the point of focus, discussed further below, will qualify as lossless priority data than image data for display outside the user focal region. In some cases, however, even image data close enough to the point of focus to fall within the user focal region may have certain low order bits cut from transmission as even in the user focal region, the low order bits do not satisfy the low perception criteria. For example, a low number, e.g. 2 bits, of the least significant bits in a word size for color may be allowed to be transmitted using lossy transmission as the data is so close to surrounding color data and the object of focus is far enough away in the display field of view to be beyond a color resolving power of the eye, and perhaps the near-eye display.

In step 258, responsive to at least some of the image data qualifying as allowed loss data, the computer system transmits the allowed loss data using one or more communication techniques allowing for lossy transmission, and in step 260 transmits lossless priority image data which is any of the image data not qualifying as allowed loss image data using one or more communication techniques satisfying lossless transmission criteria.

Figure 3B:
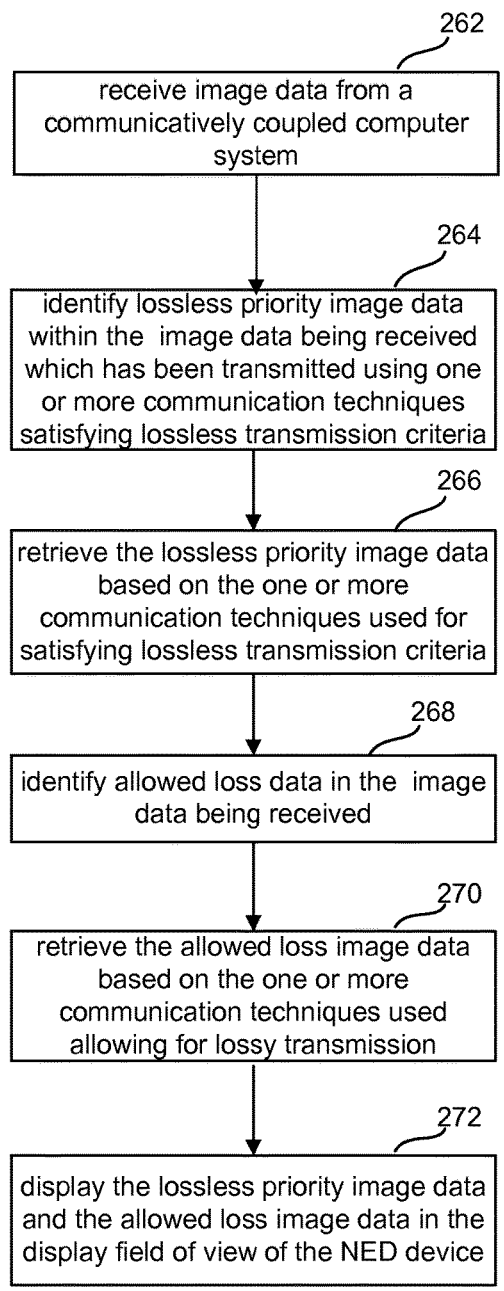
FIG. 3B is a flowchart of an embodiment of a method for reducing display update time for a NED device from the perspective of a receiving computer system of a NED device system.

FIG. 3B is a flowchart of an embodiment of a method for reducing display update time for a NED device from the perspective of a receiving computer system of a NED device system. As shown above, examples of a receiving computer system of a NED device system may be the hardware and software components of the control circuitry 136 comprising the processing unit 210, memory 244, and communication module 137 or a computer system embodied in the companion processing module 4.

In step 262, the receiving computer system receives image data from a communicatively coupled computer system, and in step 264, identifies lossless priority image data within the image data being received which has been transmitted using one or more communication techniques satisfying lossless transmission criteria. In step 266, the receiving computer system retrieves the lossless priority image data based on the one or more communication techniques used for satisfying lossless transmission criteria.

In step 268, the receiving computer system identifies allowed loss data in the image data being received, and in step 270, retrieves the allowed loss image data based on the one or more communication techniques used allowing for lossy transmission. In step 272, the NED device displays the lossless priority image data and the allowed loss image data in the display field of view of the NED device.

As mentioned above, eye tracking data can identify a point of gaze which can be used to approximate a fovea location. A user focal region can be identified as a region in space from which it is approximated light falls within an angular distance of an approximated fovea location or an approximated center of the fovea. For example using the eight degree approximation noted above, image data in a region within eight degrees of a fovea center falls within a user focal region. Secondary regions may also be identified. "Secondary" is used to denote that these regions are not in the user focal region. Image data for the user focal region is of primary importance or takes priority over image data for the secondary regions which the user cannot naturally see as well.

Besides varying resolution of image data based on distance from a point of focus or location within a designated region, different display update rates may be applied to image data based on its distance or associated region. For example, data in a secondary region may be updated at 30 frames per second while data within a user focal region is updated at 60 frames per second.

Furthermore, a quality of service (QoS) indicator may be stored for each subdivision of an image, e.g. pixel or voxel as part of its stored image data. The QoS indicator can therefore be used to distinguish priorities in the image data and an amount and type of allowed data loss for the subdivision. For example, there may be less allowed data loss for color than for luminance. The pixels quantized into one QoS bucket congregate in one area of the image based on how the eye works. Additionally, a different QoS number or indicator may be stored for each bit associated with a pixel which may be used by the transmitting computer in determining whether the bit satisfies low perception criteria or not. A result of such an approach may be higher loss of low priority bits the farther the image data is from the point of focus but still obtaining high image quality for the higher priority bits of that image data. Values for the one or more QoS indicators indicating different transmission treatment may be part of the lossless transmission criteria.

Figure 4A:
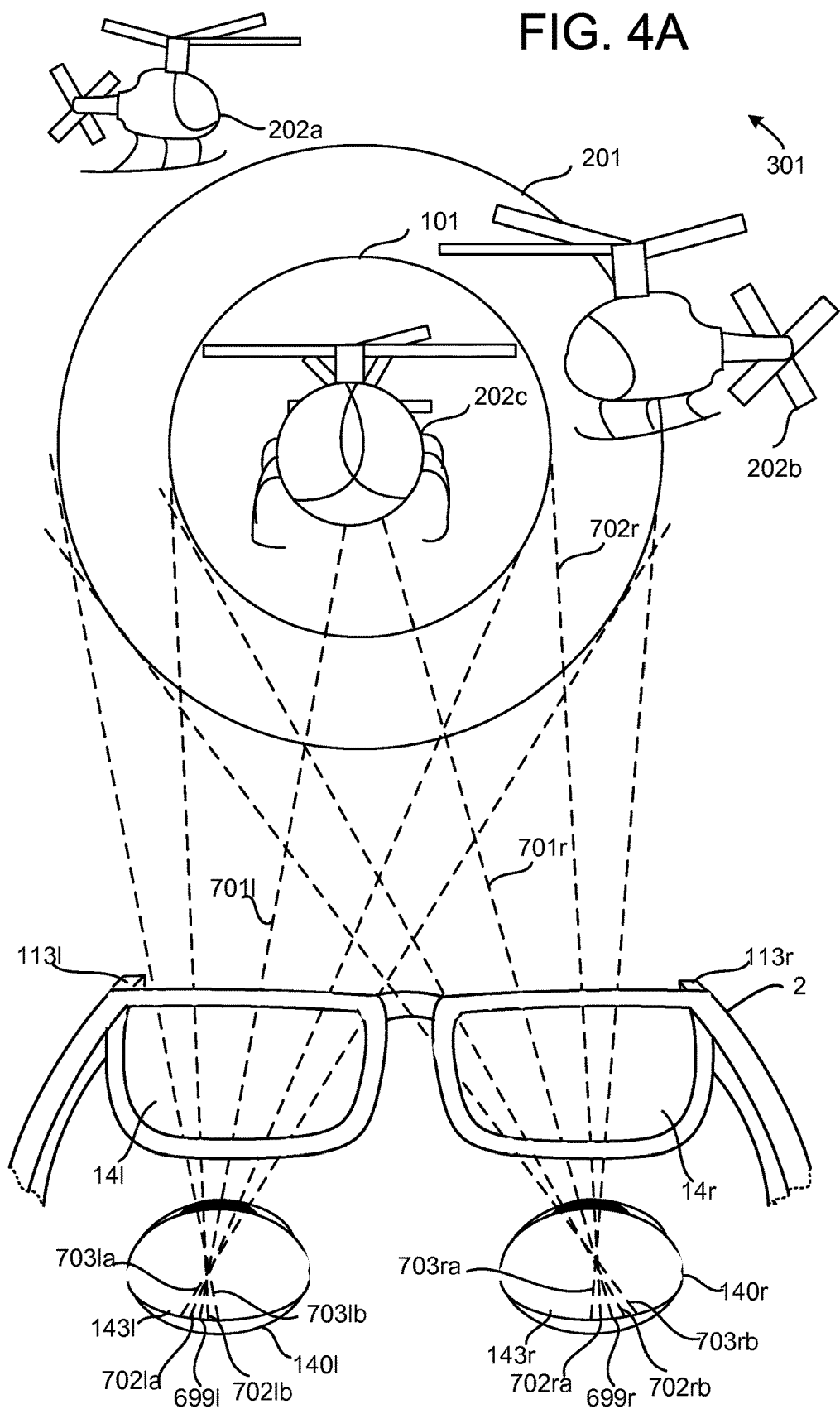
FIG. 4A illustrates an example of three-dimensional (3D) space positions of virtual objects in a 3D mapping of a space about a user wearing a display device 2.

FIG. 4A illustrates an example of three-dimensional (3D) space positions of virtual objects in a 3D mapping of a space about a user wearing a display device 2. A 3D space position identifies how much space an object occupies and where in a 3D display field of view that occupied space is positioned.

The exemplary context is a game in which a user shoots at enemy helicopters 202. (Mapping of real and virtual objects is discussed in more detail with reference to FIG. 5.)

The helicopters 202 in FIG. 4A are illustrated at a resolution which would be used by a display to satisfy the 1 arcmin in angular resolution for human foveal vision. Helicopter 202a with its tail and tail rotors is in the upper left display field of view in a third region 301 which in this example is a default region outside a user focal region and a second region outside the user focal region. Helicopter 202b is on a slightly downward trajectory coming from the right display field of view just above the center towards the center of the display field of view where helicopter 202c is heading straight towards the user and is the current object of focus as indicated by gaze lines 701l and 701r which extend from fovea on the retinas 143l and 143r. These virtual helicopters 202 are in motion, and the user is highly likely moving his head to take shots at the helicopters, so the image data is being updated in real time and in three dimensions.

Figure 4B:
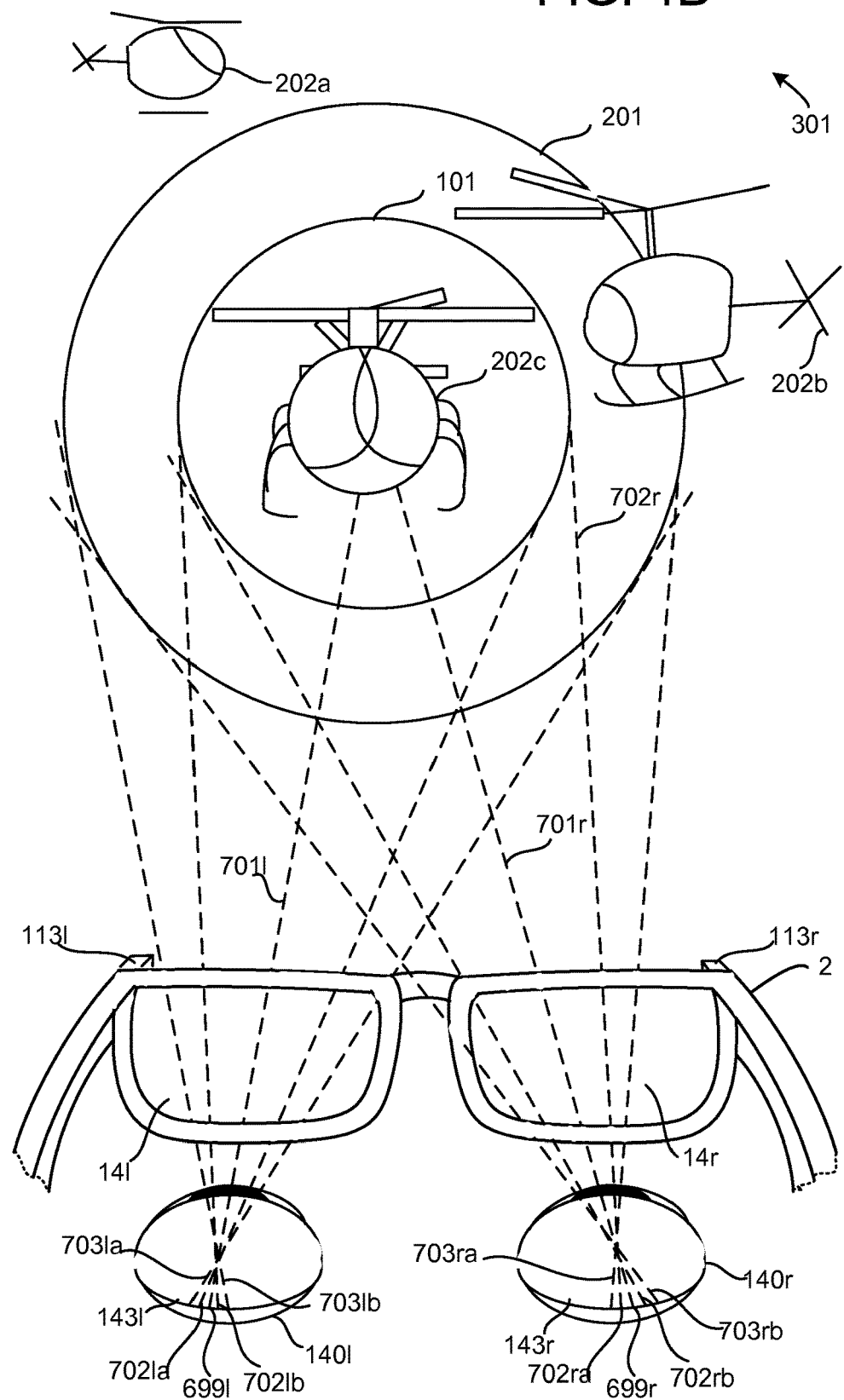
FIG. 4B illustrates an example of a display field of view including examples of virtual helicopters being displayed by a NED device with varying image resolution based on a position within a user focal region or outside the user focal region.

Due to the limits of human vision, a user would not resolve all the illustrated helicopters naturally at such a display resolution as they do not all fall within a user focal region 101. A NED device system can take advantage of the perceptual resolution differences along the human retina. FIG. 4A in use with FIG. 4B illustrate examples of lower image resolution levels including a middle or intermediate image resolution level in a second region outside the user focal region and a low image resolution level for a third region 301 outside of and farther from the user focal region image data. The QoS may tie in here as well in that the QoS stored for a subdivision of image data and a QoS stored for each bit may act as a check or bound on which bits may be loss allowable even in a lower resolution level.

FIG. 4A also illustrates examples of a user focal region 101 and secondary regions 201 and 301. In the illustrated example, a point of gaze is determined based on eye tracking data from which gaze lines 701l and 701r from each respective eye are approximated. A gaze line represents an approximation of a line of sight from the fovea of the eye into the display field of view. Where both gaze lines intersect is the point of gaze which is an example of a point of focus. A user focal region includes the point of gaze. For the left eye 140l, gaze line 701l extends from the fovea 699l which is slightly left off center on retina 143l into the display field of view to helicopter 202c. For the right eye 140r, gaze line 701r extends from the fovea 699r which is slightly right off center on retina 143r into the display field of view to helicopter 202c. Different embodiments may use modeling techniques to identify the Panum's fusional area and Horopter in the display field of view. Other embodiments, as in the current example, may use well-known approximations from fields studying human vision.

Before continuing the discussion, it is noted that the drawing is not drawn to scale. In this example of FIG. 4A, a user focal region including the point of gaze is identified by four lines 702la, 702lb, 702ra and 702rb. For this example, line 702la represents a line extending from a point about eight degrees on the retina to the left of the intersection of gaze line 701l with the fovea into the display field of view. In complement, line 702lb represents a line extending from about eight degrees on the retina to the right of the intersection of gaze line 701l with the fovea into the display field of view. Likewise, line 702ra extends from the retina about eight degrees to the left of the gaze line 701r's intersection point with the fovea into the display field of view. Line 702rb extends from the retina about eight degrees to the right of the gaze line 701*r*'s intersection point with the fovea into the display field of view.

The intersection between lines 702*lb* and 702*rb* form a point on a left boundary in the display field of view of the user focal region. Similarly, the intersection between lines 702*la* and 702*ra* form a point on a right boundary in the display field of view of the user focal region. In this example, a geometry of a sphere is used to identify the user focal region 101, and left and right boundary points represents a diameter of the sphere. Different geometries may be used as a matter of design choice, for example a rectangle, a circle, a 3D rectangle, a square or a cube.

Also shown in this example, a second region 201 is identified as well. In this area, image data for display is referred to as secondary image data for reference sake. Secondary image data is data for display outside the user focal region. Image data for a third region 301 in this example is also referred to as secondary image data. In this example, third region 301 is a default region of being outside the user focal region and the second region in the display field of view.

The second region is similarly identified as the user focal region except line 703*la* is about 15 degrees on the retina to the left of gaze line 701*l*'s intersection with the fovea, line 703*lb* is about 15 degrees on the retina to the right of gaze line 701*l*'s foveal intersection point. For the right eye, lines 703*ra* and 703*rb* extend into the display field of view from retinal intersection points respectively of about 15 degrees to the left and about 15 degrees to the right of gaze line 701*r*'s foveal intersection point. The intersection between lines 703*lb* and 703*rb* form a point on a second left boundary in the display field of view of the second region, the intersection between lines 703*la* and 703*ra* form a point on a second right boundary in the display field of view of the second region. Sphere 201 having these second left and right boundaries and including the user focal region and, thereby, the point of gaze represents the second region.

Although human vision may extend up to about 200 degrees including peripheral vision, a display field of view as noted previously may not extend as far. For example, from approximated locations of fovea for a NED device, e.g. determined based on a head size and models of eyes for that head size from the eyeglass industry and HMD fields, a display field of view may extend about 60 degrees in each of three dimensions, e.g. horizontally 60 degrees across, vertically and in depth. The user focal region 101 and second region 201 represent about 30 degrees of display field of view.

As noted above, natural eyesight resolution falls off by half between eight degrees and 15 degrees from the fovea on the retina, and falls off by another half after 15 degrees. In this example, the user focal region has a display resolution satisfying the 1 arcmin angular resolution, the second region has a middle resolution satisfying about 2 arcmin angular resolution, and the third region has a low resolution. For example, the low resolution may satisfy 4 arcmin angular resolution. In some examples, data beyond the second region may not even be displayed or may have lowest priority for display for maintaining display update rate constraints.

FIG. 4B illustrates an example of a display field of view including examples of virtual helicopters being displayed by a NED device with varying image resolution based on a position within a user focal region or outside the user focal region. As helicopter 202*a* is in the third region, which in this example a user would see with a quarter of the natural eye angular resolution of the user focal region. The image data of helicopter 202*a* is presented at a low image resolution which satisfies this eye resolving power. Its tail rotors are lines rather than rectangular shapes with area, as is its tail. The curve of the helicopter body loses its indentations and is represented by a bounding ellipse as is the glass side portion of the chopper. The top rotors are too lines rather than all three rotors with rectangular volume. Beside the loss of resolution, a rotor may have been allowed to be lost in transmission for this third region image data, as the effect is not noticeable by the human eye. Only a piece of the bottom of the landing gear is represented by a line. The helicopters are moving as well which further decreases the natural resolution with which a user's eye would capture the image.

Helicopter 202*b* is displayed across two regions, the second and third. Downsampling of the image data may be used to obtain middle and low resolution versions. The top rotors in the second region are thinner but still have some rectangular area. The curves or indentations of the boundary of the body of the helicopter cockpit have been streamlined but the shape still has about the volume of the user focal region. The cockpit window boundary loses the precise curvature of the user focal region due to downsampling. The portions of the top rotors extending into the third region appear as lines, and the top rotor base is vertically thinned. The tail and tail rotors in the third region are displayed as lines in a similar manner as for helicopter 202*a* in the third region.

Helicopter 202*c* in the user focal region appears the same as in FIG. 4A.

Figure 4C:
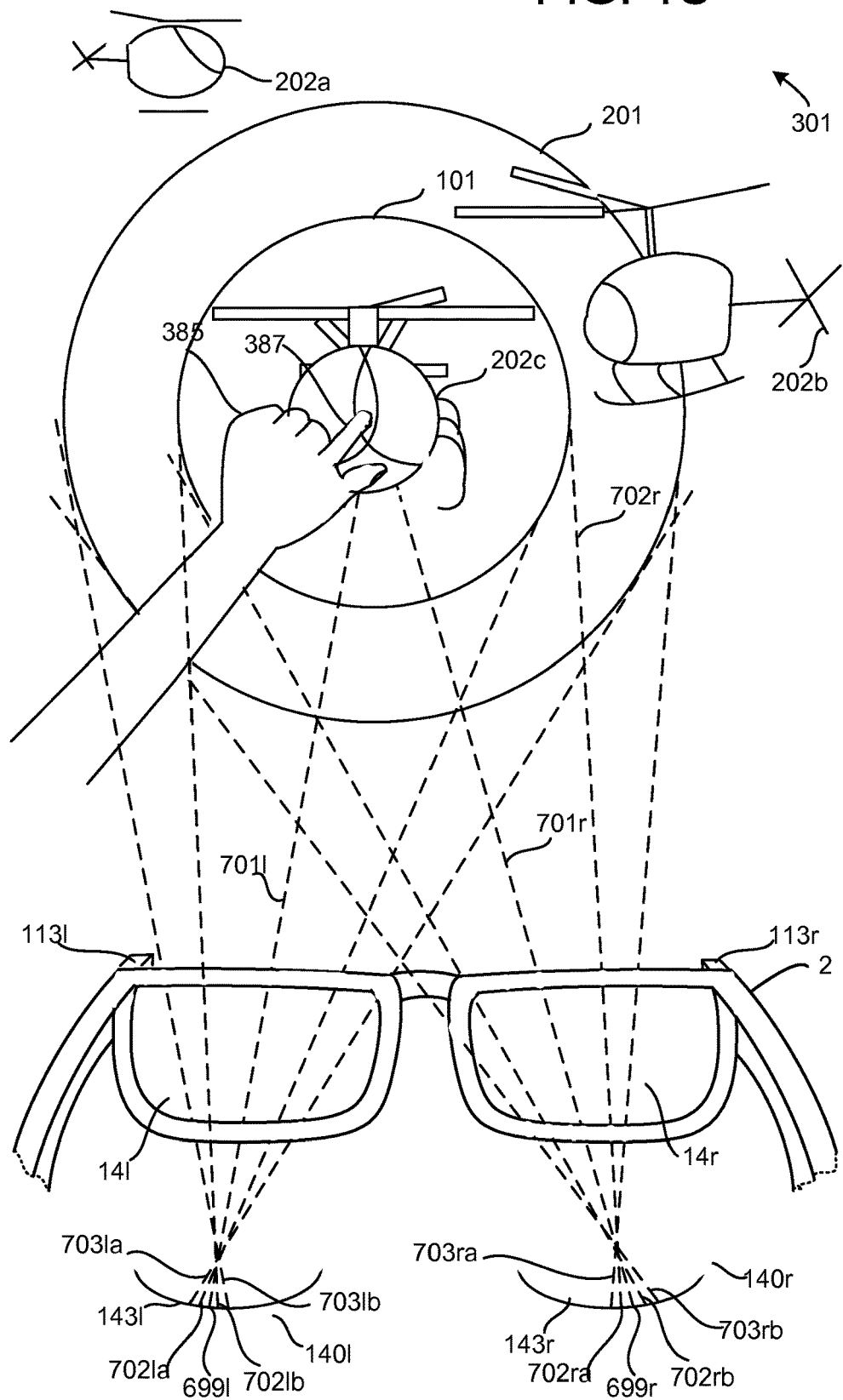
FIG. 4C illustrates another version of the helicopter example in which a gesture indicates a point of focus in the NED field of view.

FIG. 4C illustrates another version of the helicopter example of FIG. 3B in which a gesture indicates a point of focus in the NED field of view. In the example, a human finger 387 of a human hand 385 is detected performing a pointing gesture at helicopter 202*c*. A gesture with respect to an object can also be used to identify an object of focus. For example, a virtual or real object may be pointed to with a finger or handheld object or the user may make a holding or grasping gesture with respect to an object, real or virtual. The user focal region 101 and secondary regions 201 and 301 may be identified based on an approximated location for a fovea on an approximated location of each retina 143. For example, a retina location may be approximated based on the head size of the NED display device and a model of the human eyeball. An example of such a model is the Gull-strand schematic eye model. From 3D mapping coordinates of the object or point to which the gesture is directed, the position of the object or point in the display field of view can be related back to one or more reference points on the device such as where each optical axis 142 intersects its respective display unit which can then be related to one or more intersections points on the approximated retina location. In other examples, the object or point of focus can be related back by its 3D mapping coordinates directly to one or more intersection points on each approximated retina location.

In this example, angular distances from the one or more intersection points on the approximated retina locations can also be used just like in the example of FIGS. 4A and 4B to identify secondary regions. For illustrative purposes, rays shown as lines 701*l* and 701*r* from the point in the display field of view to which the user is pointing as indicated by finger 387 are traced back to the intersections points at the location of the approximated retina 143 and act effectively as gaze lines.

In other examples, based on the type of application, a point of focus and user focal region may be identified based on where image data is determined to be displayed in the display field of view. In other words, the user focal region is selected based on a prediction of where a user will turn his or her focus as a user will tend to look at new data being displayed or data which changes its motion pattern. A combination of two or more of these ways of identifying a user focal region may also be used. For example, a predetermined location in the field of view for a change in image data to occur can be used as a user focal region while waiting for an update to the user focal region based on eye tracking data to keep the display update time within an update time criteria.

Figure 5:
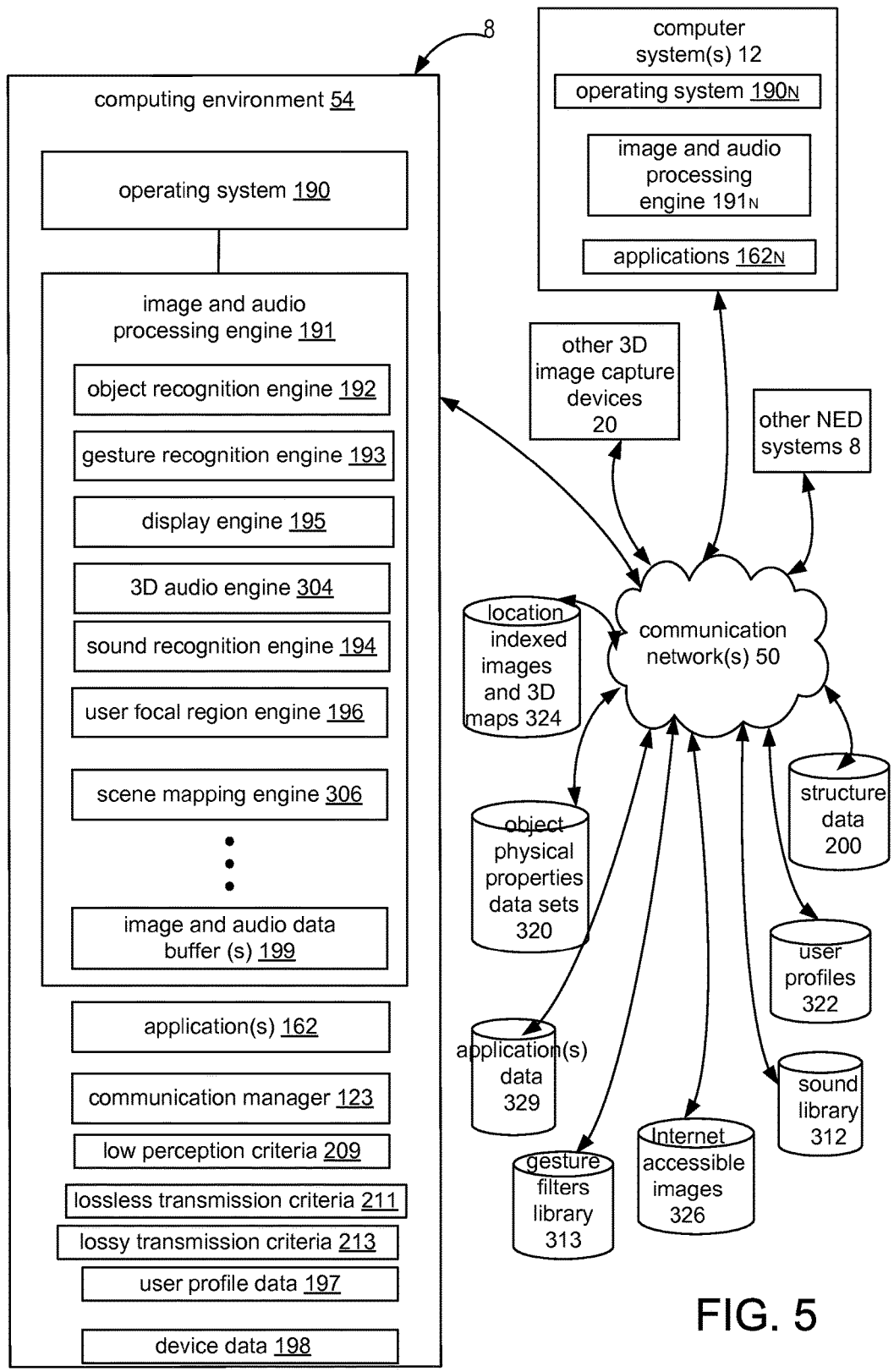
FIG. 5 is a block diagram of an embodiment of a system from a software perspective for displaying image data by a near-eye display device.

FIG. 5 is a block diagram of an embodiment of a system from a software perspective for displaying image data by a near-eye display device. FIG. 5 illustrates an embodiment of a computing environment 54 from a software perspective which may be implemented by a system like NED system 8, one or more remote computer systems 12 in communication with one or more NED systems or a combination of these. Additionally, a NED system can communicate with other NED systems for sharing data and processing resources, and may communicate with other image capture devices like other 3D image capture devices 20 in an environment for data as well.

In this embodiment, an application 162 may be executing on one or more processors of the NED system 8 and communicating with an operating system 190 and an image and audio processing engine 191. The application may be for an augmented reality experience, a virtual reality experience, or an enhanced vision experience. In the illustrated embodiment, a remote computer system 12 may also be executing a version 162N of the application as well as other NED systems 8 with which it is in communication for enhancing the experience.

Application data 329 for one or more applications may also be stored in one or more network accessible locations. Some examples of application data 329 may be rule datastores, image data for objects and imagery of the application, reference data for one or more gestures associated with the application which may be registered with a gesture recognition engine 193, execution criteria for the one or more gestures, physics models for virtual objects associated with the application which may be registered with an optional physics engine (not shown) of the image and audio processing engine, and object properties like color, shape, facial features, clothing, etc. of the virtual objects which may be linked with object physical properties data sets 320.

As shown in the embodiment of FIG. 5, the software components of a computing environment 54 comprise the image and audio processing engine 191 in communication with an operating system 190. Image and audio processing engine 191 processes image data (e.g. moving data like video or still), and audio data in order to support applications executing for a head mounted display (HMD) device system like a NED system 8. An embodiment of an image and audio processing engine 191 may include various functionality. The illustrated embodiment shows a selection of executable software elements which may be included, and as indicated by the . . . , other functionality may be added. The illustrated embodiment of an image and audio processing engine 191 includes an object recognition engine 192, gesture recognition engine 193, display data engine 195, a 3D audio engine 304, a sound recognition engine 194, user focal region engine 196 and a scene mapping engine 306.

The computing environment 54 also stores data in image and audio data buffer(s) 199. The buffers provide memory for image data and audio data which may be captured or received from various sources. For example, the buffers may store image data for display received over a communication medium by either the NED device 2 or companion processing module 4 from a communicatively coupled computer system 12. The buffers may exist on both the NED, e.g. as part of the overall memory 244, and may also exist on the companion processing module 4. One or more buffers on the companion processing module 4 may hold image data for display to be transmitted to the NED device 2. Some other types of image data which may be stored in the buffers, at least temporarily, are image data captured from the outward facing capture devices 113 of the NED system 8, image data captured by other capture devices (e.g. 3D image capture devices 20 and other NED systems 8 in the environment) if available, image data from an eye tracking camera of an eye tracking system if used. The buffer may also provide buffers for holding image data of virtual objects to be displayed by the image generation units 120, and buffers for both input and output audio data like sounds captured from the user via microphone 110 and sound effects for an application from the 3D audio engine 304 to be output to the user via audio output devices like earphones 130.

The individual engines and data stores in FIG. 5 provide as a supporting platform of data and tasks which an application 162 can leverage. The various engines of the image and audio processing engine 191 for implementing its one or more functions by sending requests identifying data for processing and receiving notification of data updates. The operating system 190 facilitates communication between the various engines and applications. The operating system 190 makes available to applications which gestures the gesture recognition engine 193 has identified, which words or sounds the sound recognition engine 194 has identified, and the positions of objects from the scene mapping engine 306 as described above.

The scene mapping engine 306 is first described. A 3D mapping of the display field of view of each display of a NED device can be determined by the scene mapping engine 306 based on captured image data and depth data. The 3D mapping includes 3D positions for objects, whether real or virtual, in the display field of view. In some embodiments, particularly for a display, the 3D mapping may include 3D space positions or position volumes for objects as examples of 3D positions. A 3D space is a volume of space occupied by the object. A 3D space position represents position coordinates for the boundary of the volume or 3D space in a coordinate system including the display field of view. Depending on the precision desired, the 3D space can match the 3D shape of the object or be a less precise bounding shape. In some examples the 3D space position includes additional information such as the object's orientation. In other examples, a 3D position includes a 2D bounding shape for example, a bounding circle, rectangle, triangle, etc. and a depth position in the display field of view for an object.

A depth map representing captured image data and depth data from outward facing capture devices 113 can be used as a 3D mapping of a display field of view of a near-eye display. The depth map has a view dependent coordinate system for the display field of view approximating a user perspective. The captured data may be time tracked based on capture time for tracking motion of real objects. Virtual object positions can be registered in the depth map.

Mapping what is around the user in the user's environment can be aided with sensor data. Data from an inertial sensing unit 132, e.g. a three axis accelerometer and a three axis magnetometer, determines position changes of the user's head and correlation of those head position changes with changes in the image and depth data from the outward facing capture devices 113 can identify positions of objects relative to one another and at what subset of an environment or location a user is looking.

The scene mapping engine 306 can also use a view independent coordinate system for 3D mapping, and a copy of a scene mapping engine 306 may be in communication with other scene mapping engines 306 executing in other systems (e.g. 12, 20 and 8) so the mapping processing can be shared or controlled centrally by one computer system which shares the updated map with the other systems. Overlapping subject matter in the depth images taken from multiple perspectives may be correlated based on a view independent coordinate system and time, and the image content combined for creating the volumetric or 3D mapping of a location or environment (e.g. an x, y, z representation of a room, a store space, or a geofenced area). Thus, changes in light, shadow and object positions can be tracked.

The view independent map can be stored in a network accessible location like location indexed images and 3D maps 324. Some examples of location data for searching the location indexed image and 3D maps 324 are GPS data from a GPS transceiver of the location sensing unit 144 on the near-eye display (NED) or an IP address of a WiFi hotspot or cellular station to which the NED system 8 has a connection. (For more information on collaborative scene mapping between HMDs like apparatus 8 and computer systems 12 with access to image data, see "Low-Latency Fusing of Virtual and Real Content," having U.S. patent application Ser. No. 12/912,937 having inventors Avi Bar-Zeev et al. and filed Oct. 27, 2010 and which is hereby incorporated by reference.)

The scene mapping engine 306 tracks the position, orientation and movement of real and virtual objects in the display field of view or a volumetric space about the user based on communications with the object recognition engine 192 of the image and audio processing engine 191 and one or more executing applications 162 causing image data to be displayed.

The object recognition engine 192 of the image and audio processing engine 191 detects and identifies real objects, their orientation, and their position in a display field of view based on captured image data and captured depth data if available or determined depth positions from stereopsis. The object recognition engine 192 distinguishes real objects from each other by marking object boundaries and comparing the object boundaries with structural data. One example of marking object boundaries is detecting edges within detected or derived depth data and image data and connecting the edges. A polygon mesh may also be used to represent the object's boundary. The object boundary data is then compared with stored structure data 200 in order to identify a type of object within a probability criteria. Besides identifying the type of object, an orientation of an identified object may be detected based on the comparison with stored structure data 200.

Structure data 200 accessible over one or more communication networks 50 may store structural information such as structural patterns for comparison and image data as references for pattern recognition. Besides inanimate objects, as in other image processing applications, a person can be a type of object, so an example of structure data is a stored skeletal model of a human which may be referenced to help recognize body parts. The image data may also be used for facial recognition. The object recognition engine 192 may also perform facial and pattern recognition on image data of the objects based on stored image data from other sources as well like user profile data 197 of the user, other users profile data 322 which are permission and network accessible, location indexed images and 3D maps 324 and Internet accessible images 326. Motion capture data from image and depth data may also identify motion characteristics of an object. The object recognition engine 192 may also check detected properties of an object like its size, shape, material(s) and motion characteristics against reference properties stored in structure data 200. The reference properties (e.g. structure patterns and image data) may also be accessed by applications for generating virtual objects.

For real objects, data may be assigned for each of a number of object properties 320 like 3D size, 3D shape, type of materials detected, color(s), and boundary shape detected. In one embodiment, based on a weighted probability for each detected property assigned by the object recognition engine 192 after comparison with reference properties, the object is identified and its properties stored in an object properties data set 320N. More information about the detection and tracking of objects can be found in U.S. patent application Ser. No. 12/641,788, "Motion Detection Using Depth Images," filed on Dec. 18, 2009; and U.S. patent application Ser. No. 12/475,308, "Device for Identifying and Tracking Multiple Humans over Time," both of which are incorporated herein by reference in their entirety.

The scene mapping engine 306 and the object recognition engine 192 exchange data which assist each engine in its functions. For example, based on an object identification and orientation determined by the object recognition engine 192, the scene mapping engine 306 can update a 3D space position or position volume for an object identifying the orientation for more accuracy. For example, a chair on its side has different position coordinates for its volume than when it is right side up. A position history or motion path identified from 3D positions updated for an object by the scene mapping engine 306 can assist the object recognition engine 192 identify an object, particularly when it is being partially occluded.

In one embodiment, the user focal region engine 196 communicates with the application 162 and the scene mapping engine 196 for identifying coordinates in the 3D display field of view of image data scheduled to be displayed. For example, the application 162 may identify a pop-up menu to be displayed in an upper left position with a depth of 20 cm, and the scene mapping engine 306 identifies this position in the 3D mapping coordinates of the display field of view. The pop-up menu will be an object of focus. In some examples, the display field of view is organized into cubes or other volumetric units. Any cube including a portion of the object of focus is considered part of the user focal region.

In another embodiment, based on the 3D position, e.g. including a depth component, of the object of focus in the display field of view and an approximated location of each retina and a fovea on each retina, a gaze line for each eye may be projected back from the object of interest to an approximated respective fovea location by the user focal region engine 196. Boundaries of the user focal region and other secondary regions can be determined by tracing rays originating on each approximated retinal location at different angular distances from the approximated foveal intersection point of the gaze line.

As discussed above for FIG. 3C in which a gesture, such as a pointing gesture, is recognized based on image data and identifies a point or an object of focus, the user focal region engine 196 may determine boundary regions in the same way as in the preceding paragraph and in the discussion of FIG. 3C.

In another embodiment, the user focal region engine 196 comprises eye tracking software for processing image data captured by the eye tracking system 134 for identifying a point or object of gaze. The region boundaries for the user focal region and secondary boundaries may be identified as discussed in the preceding examples. In the example of FIG. 2B, the eye tracking software processes image data of the eye captured about the optical axis 142 and can determine a gaze line, assuming a fixed spatial relationship between the user's eye and the display device.

In models of the eye, an example of which is the Gullstrand model, a center of rotation of the eye, a center of a cornea and a center of a pupil are aligned along an optical axis of the eye. The optical axis has a small angular correction applied to it so that it is modeled as the visual axis extending from the fovea which is a small angle, e.g. 1.2 degrees, off from the center of rotation. In some examples, such as described in U.S. patent application Ser. No. 13/221,739 to Lewis et al., a gaze detection coordinate system is generated spatially relating the center of rotation, center of the cornea and pupil center to an IR sensor capture point of the NED device, e.g. IR and visible reflecting element 134E, and IR illuminators for generating glints. In the integrated eye tracking example, the IR illuminator positions may also be on the reflecting element 134E. For example, see U.S. patent application Ser. No. 13/245,700 to Bohn. A change in the spatial relationship can be identified, for example, by detecting a change in the size of the iris perimeter, which triggers a redetermination of the spatial relationship between the eye and display. In other embodiments, as discussed above, a predetermined approximation of the location of the retina and fovea are used, for example based on head size of the NED device.

With the spatial relationship determined, pupil position within the eye socket is determined from image data of the eye. The user focal region engine 196 executing on one or more processors identifies a black pupil area in a number of image data samples of the respective eye which samples may be averaged to adjust for headshake. An assumption may be made that a pupil is a circle and when viewed from an angle, is an ellipse. One axis of the ellipse, the major axis, remains constant as it represents the diameter of the pupil which does not change, provided the lighting does not change, as pupil size changes with lighting changes.

The pupil appears as a circle in an image format such as an image frame of a camera having its detection area centered on the optical axis of the display assuming a pupil looks along a display optical axis 142 when looking straight ahead through the display. As the pupil changes its gaze and moves from the center of the image frame, the pupil appears as an ellipse, as a circle viewed from an angle appears as an ellipse. The width of the minor axis of the ellipse changes with gaze changes, and the width change can be measured to indicate a change in viewing angle of the pupil from the straightahead position in which the pupil closely approximates a circle in image data. A narrow ellipse to the left of the center of the image frame indicates the user is looking to the far right. A wider ellipse a distance less to the right of the center of the image frame indicates the user is looking left but not far left.

The center of the pupil is the center of the ellipse. The ellipse is fitted from detected edge points in the image. Because such edge points are noisy and not all of them are on the ellipse, the ellipse fitting process is repeated many times over randomly selected subsets of all edge points. The subset that is most consistent with all the edge points is used to obtain the final ellipse. With the center of rotation, the cornea center and the pupil center identified, one can extend a ray from the center of rotation through the cornea and pupil centers to obtain an optical axis for the eye. After determining the optical axis, a default offset angle may be applied so that the optical axis approximates the visual axis and is selected as the gaze vector.

In some embodiments, the user focal region engine 196 compares the fitted ellipse or the IR captured image data of the eye with previously obtained training images data. The training images may have been obtained during an initialization of the eye tracking system 134 as part of an initialization process for operating the NED device. Each training image has a predetermined gaze angle associated with it from which a gaze line or vector can be generated.

For determining a point of gaze, the user focal region engine 196 determines an intersection point of the gaze vectors in 3D space in front of the user and determines whether that intersection point, the point of gaze which is an example of a point of focus, is within the 3D mapping of the display field of view, and any object, real or virtual, associated with the point of gaze. The boundaries of the user focal region and the secondary regions may be determined as described above.

In some embodiments, the user focal region engine 196 may simply identify the point of focus and the object of focus which the display engine 195 or an application 162 uses to determine a distance of image data to the point of focus.

In some embodiments, the scene mapping engine 306 checks for updates in the point of focus provided by the user focal region engine 196, and determines a distance vector in the display field of view to image data to be displayed in accordance with an executing application from the point of focus. The distance vector is sent to the user focal region engine 196 for determining an angular distance on each retina to which the image data reflects. Based on the angular distance and the low perception criteria 209, the user focal region engine 196 determines which of the image data qualifies as allowed loss data and notifies the scene mapping engine 306 of the determination result.

In other embodiments, the scene mapping engine 306 identifies whether the image data to be displayed is allowed loss data based on the low perception criteria 209 and whether the image data falls within a user focal region or other secondary region identified in the display field of view by the user focal region engine 196.

The scene mapping engine 306 notifies the communication manager 123 of the communication module 250 which image data has qualified as allowed loss data. The communication manager 123 access the stored lossless transmission criteria for determining how to transmit data which does not qualify as allowed loss data and accesses lossy transmission criteria 213 for identifying bounds or limitation on lossy transmission. Lossy transmission criteria may include criteria for the same types of communication characteristics and quality of service indicators as in lossless transmission criteria.

The 3D audio engine 304 is a positional 3D audio engine. A sound to be played for a virtual object can be uploaded to a sound library 312 by an application 162 which instructs the 3D audio engine 304 when to play the sound based on execution rules for the application. The 3D audio engine identifies the 3D position of the virtual object from the 3D mapping and generates the sound to make the sound seem to come from the identified 3D position when played by the earphones 130 or other audio output devices like speakers in other embodiments. Additionally, based on audio data as may be stored in the sound library 312 and voice data files stored in user profile data 197 or user profiles 322, sound recognition engine 194 identifies audio data from the real world received via microphone 110 for application control via voice commands and for location and object recognition.

The gesture recognition engine 193 identifies one or more gestures. A gesture is an action performed by a user indicating a control or command to an executing application. The action may be performed by a body part of a user, e.g. a hand or finger, but also an eye blink sequence of an eye can be a gesture. In one embodiment, the gesture recognition engine 193 compares a skeletal model and movements associated with it derived from the captured image data to stored gesture filters in a gesture filters library 313 to identify when a user (as represented by the skeletal model) has performed one or more gestures. In some examples, matching of image data to image models of a user's hand or finger during gesture training sessions may be used rather than skeletal tracking for recognizing gestures. More information about the gesture recognition engine 193 can be found in U.S. patent application Ser. No. 12/422,661, "Gesture Recognizer System Architecture," filed on Apr. 13, 2009, incorporated herein by reference in its entirety. More information about recognizing gestures can be found in U.S. patent application Ser. No. 12/391,150, "Standard Gestures," filed on Feb. 23, 2009; and U.S. patent application Ser. No. 12/474,655, "Gesture Tool," filed on May 29, 2009, both of which are incorporated by reference herein in their entirety.

An embodiment of a natural user interface (NUI) in one or more embodiments of the NED device system 8 may include the outward facing capture devices 113 and the gesture recognition engine 193 for identifying a gesture which is an example of at least one user physical action of at least one body part. The eye tracking system 134 and eye tracking software executing in an embodiment of the user focal region engine 196 for interpreting eye movements based on the data captured by the system 134 may also be components in another embodiment of a natural user interface for the NED device system 8. Eye based actions like a blink sequence indicating a command, a point of gaze, a gaze pattern, gaze duration or eye movements are also some examples of natural user input as one or more user physical actions of at least one body part. The natural user input is represented in natural user input data such as image data identified by the eye tracking software and represented in eye tracking data. The microphone and sound recognition engine 194 can also process natural user input of voice commands which may also supplement other recognized physical actions such as gestures and eye gaze. In some embodiments, the user focal region engine 196 may be executing on a communicatively coupled computer system (e.g. 4 or 8), and image data from the eye tracking system 134 and the outward facing capture devices 113 are sent via a back channel from the NED device, so gaze related and gesture recognition processing is offloaded from the control circuitry 136 of the NED device.

An application 162 identifies a target 3D space position in the 3D mapping of the display field of view for an object represented by image data and controlled by the application. For example, the helicopter application identifies changes in the position and object properties of the helicopters 202*a*, 202*b* and 202*c* based on the user's actions to shoot down the virtual helicopters. Display data engine 195 relates the target 3D space position in the display field of view to display coordinates of the display unit 112. The display data engine 195 performs translation, rotation, and scaling operations for display of the image data at the correct size and perspective. The application or the display data engine 195 may update the scene mapping engine about the positions of the image data objects. In many embodiments, image data for display received from the communicatively coupled companion processing module 4 or other computer system 12, had its image resolution adjusted based on its position in the display field of view in relation to the user focal region before it was transmitted.

The following discussion describes some example processing for updating an optical see-through, augmented reality (AR) display to position virtual objects so that they appear realistically at 3D locations determined for them in the display. In one example implementation a Z-buffer stores data for each separately addressable display location or area, e.g. a pixel. The display data engine 195 renders the 3D mapping of the display field of view in the Z-buffer with both real object boundaries and virtual object boundaries. The real object boundaries in the Z-buffer act as references for where the image data objects are to be three dimensionally positioned in the display as the image generation unit 120 displays the image data objects but not real objects as the NED device, in this example, is an optical see-through display device. Color information for the image data is written into a corresponding color buffer.

A depth value is stored for each display location or a subset of display locations, for example for each pixel (or for a subset of pixels). In this embodiment, layering of image data based on depth values results for both the Z-buffer and color buffer results in a composite image which the image generation unit 120 is controlled to display. The display update process can be performed many times per second (e.g., the refresh rate).

For a video-see, augmented reality display or operation of a see-through display in a video-see mode, image data of the real objects is also written into the Z-buffer and corresponding color buffer with the image data of virtual objects or other enhanced objects. In a video-see mode, an opacity filter of each see-through display 14 can be tuned so that light reflected from in front of the glasses does not reach the user's eye 140, and the 3D image data of both the real and virtual or enhanced objects is played on the display.

Device data 198 may include an identifier for the personal apparatus 8, a network address, e.g. an IP address, model number, configuration parameters such as devices installed, identification of the operating system, what applications are available in the NED system 8 and are executing in the NED system 8, and may also include data from sensors or sensing units or determined from the sensors or sensing units like the orientation sensors in inertial sensing unit 132, and the one or more location and proximity transceivers in location sensing unit 144. Furthermore, characteristics for hardware components like the display unit, opacity filter, processing units, memory, communication module, image generation unit, and power supply may also be stored in the device data. Some examples of such characteristics are display resolution, processor speed, memory size and type, watts on power supply, illumination output of image generation unit, types of transmitter and receivers or transceivers in the communication module, antenna power, communication protocols supported like IEEE 802.11 family members, cellular, infrared, types of wired or wireless interfaces available like USB, types of modulation schemes supported like spread spectrum and constellation encoding schemes, carrier band frequencies supported, error correction and compression techniques supported.

The technology may be embodied in other specific forms without departing from the spirit or essential characteristics thereof. Likewise, the particular naming and division of modules, routines, applications, features, attributes, methodologies and other aspects are not mandatory, and the mechanisms that implement the technology or its features may have different names, divisions and/or formats.

For illustrative purposes, the method embodiments below are described in the context of the system and apparatus embodiments described above. However, the method embodiments are not limited to operating in the system embodiments described above and may be implemented in other system embodiments. Furthermore, the method embodiments may be continuously performed while the NED system is in operation and an applicable application is executing.

FIG. 6 is a flowchart of an embodiment of a method for identifying regions for displaying image data in a display field of view of the near-eye display (NED). In the illustrative context of FIG. 5, the scene mapping engine 306 continuously updates a 3D mapping including the display field of view based on sensor data detected by the NED device in step 422. The discussion for FIG. 5 provided examples of sensor data like head position data based on the inertial sensing unit 132 and image data captured by outward facing cameras 113. In step 424, a point of focus is identified, for example by the user focal region software 196 as discussed above, and in step 426, coordinates are identified in the 3D mapping of the display field of view of a first region including the point of focus which is referred to as the user focal region. Based on the user focal region and human vision criteria, in step 428, coordinates in the 3D mapping of one or more secondary regions outside the user focal region are identified as well. As illustrated in the example of FIGS. 4A, 4B and 4C, angular distances predetermined from research of the human eye is an example of human vision criteria. Additionally, as illustrated in that example, different image resolutions may be applied within and outside the user focal region.

FIG. 7 is a flowchart of another embodiment of a method for determining secondary regions in the display field of view and image resolutions associated with them. In some examples, the method embodiment of FIG. 7 may be performed by a companion processing module 4 of the NED device system 8 or a network accessible computer system 12 which communicates with a communication module of the companion processing module 4, the NED device 2 or both as the mapping data may be shared across systems, and applications may be executing across computer systems. In step 502, coordinates are identified in the 3D mapping of a second region from a boundary of the user focal region to a second angular distance from the point of focus. In step 504, coordinates are identified in the 3D mapping of a third region from a boundary of the second region to a third angular distance from the point of focus. Based on one or more executing applications, image data for display in the second region is identified in step 506, and in step 508, image data for display in the third region is identified. To further reduce bandwidth for sending image data and thus reduce display update time, the secondary image data for the second and third regions can be reduced in image resolution. One example of reducing image data is by downsampling the image data. In step 510, at least a portion of the second region image data can be down sampled to an intermediate resolution level, and in step 512, at least a portion of the third region image data can be down sampled to a resolution level which is lower in resolution than the image resolution for both the user focal region and the second region. The downsampled data may then be transmitted for the secondary regions.

Some embodiments may also include using one or more lossless compression techniques for user focal region image data and a lossy compression technique for secondary image data. Compression is not to be confused with transmission. Data compressed with lossy compression has lowered its data integrity before being transmitted, and the resulting compressed data may be transmitted for satisfying a lossless transmission criteria. Loss or losslessness in transmission is independent of loss or losslessness in compression.

FIGS. 8A and 8B illustrate embodiments wherein a distance from the point of focus is identified in regions about the point of focus. FIG. 8A is a flowchart of an embodiment of a method for reducing display update time for a NED device from the perspective of a transmitting computer system. An example of a computer system communicatively coupled to the NED device is a computer system embodied in the companion processing module 4. In another example, the transmitting computer system may be remote from the NED device system 8 such as the illustrated network accessible computer system 12. In step 602, a computer system communicatively coupled to the NED device identifies user focal region image data based on one or more executing applications, and in step 604 transmits the user focal region image data using one or more communication techniques for satisfying lossless transmission criteria. In this embodiment, the user focal region image data is treated as lossless priority data. In step 606, the computer system identifies secondary image data for display outside the user focal region based on the one or more executing applications, and in step 608 transmits at least some of the image data for display outside the user focal region using one or more communication techniques allowing for lossy transmission. In this embodiment, at least some of the secondary image data is treated as allowed loss data.

Some embodiments may use lossless transmission techniques for certain types of image data regardless of region, for example based on the content type. Some examples of content type are text and picture. Another basis may be a structural core for an object which tends to stay in a scene is sent using communication techniques for satisfying lossless transmission while overlaying layers of detail and color may be transmitted allowing for lossy transmission. In another example, an image resolution is applied to an object as a whole, unlike in the examples of FIGS. 4B and 4C. Image data for the entire object is treated according to the highest priority region which at least part of the object falls within. For example, for an object partially within the user focal region and partially outside the user focal region, image data for the object outside the user focal region is processed for transmission as if it were within the user focal region.

FIG. 8B is a flowchart of an embodiment of a method for reducing display update time for a NED device from the perspective of a receiving computer system of a NED device system. As shown above, examples of a receiving computer system of a NED device system may be the hardware and software components of the control circuitry 136 comprising the processing unit 210, memory 244, and communication module 137 or a computer system embodied in the companion processing module 4.

In step 612, the receiving computer system receives image data from a communicatively coupled computer system (e.g. 4 or 12) and in step 614 identifies user focal region image data within the image data being received. The communication module 250 may distinguish image data for different regions from one another in data being received based on a number of bases, some examples of which are which communication channel the image data comes across, which time window in a time division multiplexing scheme the image data is received within, how the data is modulated, identification data like one or more bits in a header of a data packet, and even the presence or lack of presence of error correction data in the received image data. These examples may also be used for distinguishing lossless priority image data from allowed loss data.

In step 616, the receiving computer system retrieves the user focal region image data using one or more communication techniques for satisfying lossless transmission criteria, and in step 618, identifies at least some secondary image data for display outside the user focal region within the image data being received. In step 620, the at least some secondary image data is retrieved using one or more communication techniques allowing for lossy transmission. In step 622, the NED display device, e.g. under control of the display engine 195, displays the user focal region image data and the at least some secondary image data in the display field of view of the NED device.

FIGS. 9A through 9D illustrate some examples of error correction techniques as communication techniques which may be used in transmitting image data for satisfying lossless transmission criteria and allowing for lossy transmission depending on a positional relationship, for example as represented by a distance vector, of the image data to a point of focus. FIG. 9A is a flowchart of a process example using different levels of error correction. This example focuses on applying error correction as a communication technique. In step 632, the transmitting computer system causes the communication module to encode the lossless priority image data with one or more error correction techniques for satisfying lossless transmission criteria, and in step 634, the transmitting computer system causes the communication module to encode at least some of the allowed loss data with a level of error correction allowing for lossy transmission.

FIG. 9B is a flowchart illustrating some implementation examples for the communication techniques in FIG. 9A. In step 636, the transmitting computer system causes its communication module to encode the lossless priority image data with one or more error correction techniques for satisfying lossless transmission criteria by setting one or more data integrity header bits of packets and includes redundant data for the lossless priority data, for example user focal region image data in the example of FIG. 8A. An example of such an error correction technique is a forward error correction (FEC). For at least some of the allowed loss image data, in step 638, the transmitting computer system causes the communication module to encode at least some of the allowed loss image data by setting one or more data integrity header bits of packets and omitting redundant data for the at least some of the allowed loss data.

In another example, a forward error correction (FEC) technique like a convolution coding technique like Viterbi decoding can be performed on the lossless priority data without puncturing or perforating the data and Viterbi decoding with puncturing of the data is performed on the allowed loss data. Turbo coding may also be used with and without punctured data.

FIG. 9C is a flowchart illustrating some other examples of communication techniques which may be used in retrieving lossless priority image data and the allowed loss image data from received image data. In step 642, a communication module under control of a NED system computer system performs one or more error correction techniques on the received lossless priority image data, and in step 644, omits performing one or more error correction techniques on the at least some of the allowed loss image data.

FIG. 9D is a flowchart illustrating another example of a communication technique for retrieving allowed loss image data from received image data. In step 652, a communication module under control of a receiving computer system in the NED system performs one or more error correction techniques on the received lossless priority image data, and in step 654 checks the one or more data integrity header bits for the at least some of the allowed loss image data. The communication module 250 causes one or more identifiers for allowed loss data packets which are at least one of being missing or being corrupted to be stored in step 656. In step 658, the communication module 250 stores the received allowed loss image data in memory buffers accessible by the display engine, and in step 660, responsive to display update priority criteria being satisfied, requesting transmission of the missing, corrupted or both types of data.

An example of display update priority criteria is maintaining at least a certain number of frames per second update rate in which lossless priority image data is prioritized. If there is bandwidth available in a time window prioritized for lossless priority image data, the allowed loss image data which was corrupted or failed to transmit may be included in the window which is transmitted for satisfying lossless transmission criteria. Such an embodiment may be useful for an application in which user focus shifting to an object in a secondary region is predictable or more likely than not to occur due to the nature of the application.

Figure 10A:
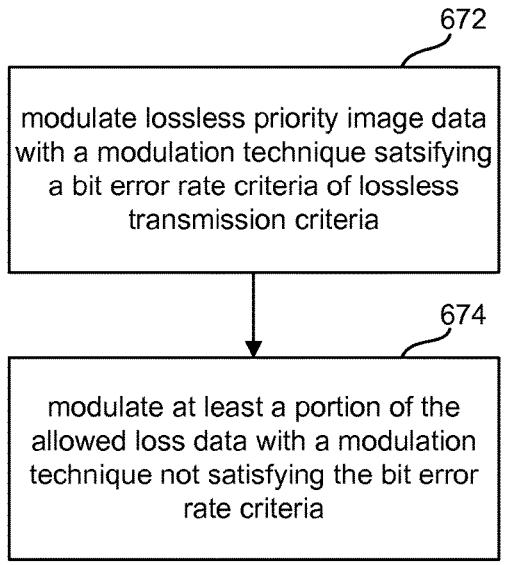
FIG. 10A is a flowchart of a process example of transmitting image data using modulation techniques which vary in quality of transmission.

FIG. 10A is a flowchart of a process example of transmitting image data using modulation techniques which vary in quality of transmission. In step 672, a transmitting computer system causes the communication module 250 to modulate lossless priority image data with a modulation technique for satisfying a bit error rate criteria of lossless transmission criteria, and in step 674, the communication module 250 under control of the transmitting computer system modulates at least a portion of the allowed loss data with a modulation technique not satisfying the bit error rate criteria.

Figure 10B:
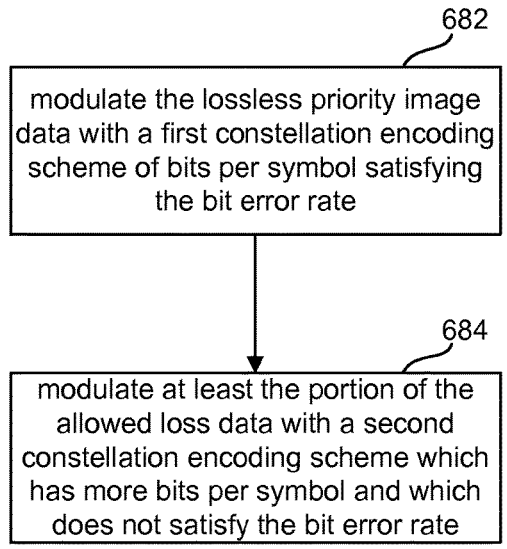
FIG. 10B is a flowchart illustrating some implementation examples for the modulation communication techniques as constellation encoding schemes.

FIG. 10B is a flowchart illustrating some implementation examples for the modulation communication techniques as constellation encoding schemes. In step 682, a transmitting computer system causes the communication module 250 to modulate lossless priority image data with a first constellation encoding scheme of bits per symbol satisfying a bit error rate criteria of the lossless transmission criteria. In step 684, the communication module 250 under control of the transmitting computer system modulates at least a portion of the allowed loss data with a second constellation encoding scheme which has more bits per symbol and which does not satisfy the bit error rate criteria of the lossless transmission criteria.

As the discussion above indicates, transmission of the allowed loss data and the lossless priority data may be at or about the same time (e.g. in a same frame) or done at separate times (e.g. different frames). Besides the frames examples, different priority bits can be prioritized within a same symbol using a same numbered constellation scheme. A constellation encoder can encode lossless priority data in higher order bits associated with constellation points in a symbol which same symbol encodes allowed loss data as the lower order bits associated with its constellation points. For example, in a QAM 16 scheme, the higher priority bits are encoded in the high order bits for each of the 16 constellation points. For example, each constellation point is associated with a pattern of 4 bits and the most significant bits of the pattern get the high order bits. The result is that the higher priority bits are encoded in different quadrants of the symbol. Constellation points in different quadrants of the symbol are separated by a bigger Hamming or modulation distance than points within the same quadrant. The lower priority bits are encoded using the remaining lower order bits so they have a probability of being in the same quadrant and closer in Hamming distance. The closer the Hamming distance, the more likely noise may cause the detector to detect a wrong bit value and hence a wrong constellation point and associated value in the constellation.

If desired, hierarchical QAM (HQAM) may be used as well in which the Hamming or modulation distance between constellation points in different quadrants is expanded at the expense of narrowing the modulation distance between points in a same quadrant. QAM encoding is particularly useful for gradual degradation in image quality bases on a continuum of distance changes from the point of focus.

Figure 10C:
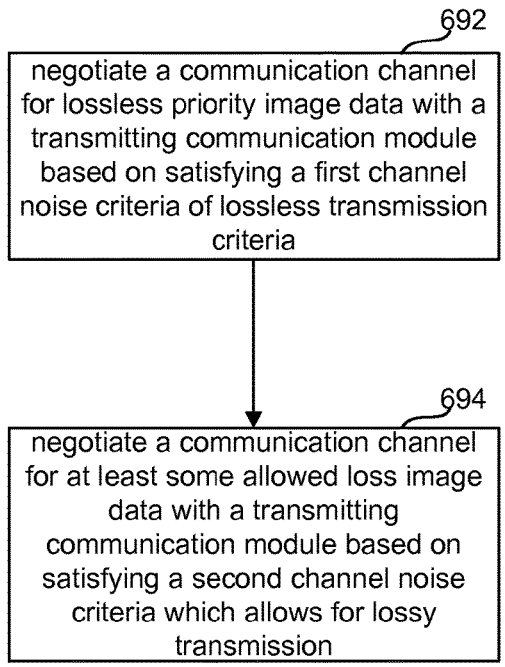
FIG. 10C is a flowchart illustrating negotiating a communication channel as a communication technique based on the priority of the image data to be transmitted and received.

FIG. 10C is a flowchart illustrating negotiating a communication channel as a communication technique based on the priority of the image data to be transmitted and received. In step 692, a communication module under control of a receiving computer system in the NED system negotiates a communication channel for lossless priority image data with a transmitting communication module based on satisfying a first channel noise criteria of lossless transmission criteria, and in step 694 negotiates a communication channel for at least some allowed loss data with a transmitting communication module based on satisfying a second channel noise criteria which allows for lossy transmission.

FIG. 11 is a block diagram of one embodiment of a computer system that can be used to implement a network accessible computing system 12, a companion processing module 4, or another embodiment of control circuitry 136 of a near-eye display (NED) device which may host at least some of the software components of computing environment 54. FIG. 11 illustrates an exemplary computer system 900. In its most basic configuration, computing system 900 typically includes one or more processing units 902 including one or more central processing units (CPU) and one or more graphics processing units (GPU). Computer system 900 also includes memory 904. Depending on the exact configuration and type of computer system, memory 904 may include volatile memory 905 (such as RAM), non-volatile memory 907 (such as ROM, flash memory, etc.) or some combination of the two. This most basic configuration is illustrated in FIG. 11 by dashed line 906. Additionally, computer system 900 may also have additional features/functionality. For example, computer system 900 may also include additional storage (removable and/or non-removable) including, but not limited to, magnetic or optical disks or tape. Such additional storage is illustrated in FIG. 11 by removable storage 908 and non-removable storage 910.

Computer system 900 may also contain communication module(s) 912 including one or more network interfaces and transceivers that allow the device to communicate with other computer systems. Computer system 900 may also have input device(s) 914 such as keyboard, mouse, pen, voice input device, touch input device, etc. Output device(s) 916 such as a display, speakers, printer, etc. may also be included.

The example computer systems illustrated in the figures include examples of computer readable storage devices. A computer readable storage device is also a processor readable storage device. Such devices may include volatile and nonvolatile, removable and non-removable memory devices implemented in any method or technology for storage of information such as computer readable instructions, data structures, program modules or other data. Some examples of processor or computer readable storage devices are RAM, ROM, EEPROM, cache, flash memory or other memory technology, CD-ROM, digital versatile disks (DVD) or other optical disk storage, memory sticks or cards, magnetic cassettes, magnetic tape, a media drive, a hard disk, magnetic disk storage or other magnetic storage devices, or any other device which can be used to store the information and which can be accessed by a computer.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:

determining a three-dimensional (3D) distance vector in a 3D field of view of a near-eye display device, the vector extending to a 3D point of focus of a user of the near-eye display device and from one of a predetermined reference point on the near-eye display device and an eye of the user, which eye is spaced apart from and not bonded to the near-eye display device, the 3D point of focus of the user being out in a corresponding 3D region of displayable scenery in the 3D display field of view, beyond the near-eye display device;

based on the determined distance vector that extends to the user's 3D point of focus and based on predetermined low perception criteria, determining whether at least some of image data of the corresponding 3D region of displayable scenery qualifies as lossless priority data which does not satisfy the low perception criteria;

based on the determined distance vector, determining whether at least some of other image data of the corresponding 3D region of displayable scenery qualifies as allowed loss data which satisfies the low perception criteria;

responsive to at least some of the image data qualifying as allowed loss data, first transmitting to the near-eye display device as first updating data, the allowed loss data, said first transmitting using one or more communication techniques allowing for lossy transmission; and responsive to at least some of the other image data qualifying as lossless priority data, second transmitting to the near-eye display device as second updating data, the lossless priority image data using one or more communication techniques satisfying lossless transmission criteria.

2. The method of claim 1 wherein transmitting to the near-eye display device the lossless priority image data includes use of a computer system using one or more communication techniques satisfying lossless transmission criteria and the method further comprises:

encoding the lossless priority image data with one or more error correction techniques for satisfying lossless transmission criteria; and wherein transmitting from the computer system to the near-eye display device the allowed loss data using one or more communication techniques allowing for lossy transmission further comprises encoding at least some of the allowed loss image data by setting one or more data integrity header bits of packets and omitting redundant data for the at least some of the allowed loss image data with a level of error correction allowing for lossy transmission.

3. The method of claim 2 wherein the one or more communication techniques for satisfying lossless transmission criteria includes forward error correction (FEC).

4. The method of claim 1 wherein the lossless transmission criteria comprises a first bit error rate satisfying a probability criteria of error-free transmission of the lossless priority image data and allowing for lossy transmission comprises allowing for a second bit error rate which does not satisfy the probability criteria.

5. The method of claim 1 wherein transmitting from the computer system to the near-eye display device the allowed loss data using one or more communication techniques allowing for lossy transmission further comprises transmitting the allowed loss image data over a communication channel not satisfying a noise criteria of the lossless transmission criteria.

6. The method of claim 1 wherein transmitting to the near-eye display device the lossless priority image data includes use of a computer system using one or more communication techniques satisfying lossless transmission criteria and the method further comprises:

modulating the lossless priority image data with a modulation technique satisfying a bit error rate criteria of the lossless transmission criteria; and wherein transmitting from the computer system to the near-eye display device the allowed loss data using one or more communication techniques allowing for lossy transmission further comprises:

modulating the at least the portion of the allowed loss image data with a modulation technique not satisfying the bit error rate criteria of the lossless transmission criteria.

7. The method of claim 6 wherein modulating the lossless priority image data with the modulation technique satisfying the bit error rate criteria of the lossless transmission criteria further comprises modulating the lossless priority image data with a first constellation encoding scheme of bits per symbol satisfying the bit error rate; and wherein modulating the at least the portion of the allowed loss image data with the modulation technique not satisfying the bit error rate criteria of the lossless transmission criteria further comprises modulating at least the portion of the allowed loss image data with a second constellation encoding scheme having more bits per symbol than the first constellation encoding scheme and which does not satisfy the bit error rate.

8. The method of claim 1 further comprising the lossless priority image data comprises user focal region image data for display in a user focal region, and the allowed loss image data comprises at least some secondary image data for display outside the user focal region; and the secondary image data has a lower image resolution than the user focal region image data.

9. The method of claim 8 further comprising the secondary image data has a different display update rate than the user focal region image data.

10. A method for reducing display update time for a near-eye display device comprising:

receiving image data representing a three-dimensional (3D) field of view of the near-eye display device;

identifying user focal region image data within the received image data, the received image data being configured for providing an update to a 3D display by the near-eye display device to spaced away eyes of a user, the eyes not being bonded with the near-eye display device, the identified user focal region image data corresponding to a 3D user focal region in the 3D field of view of the near-eye display device, the 3D user focal region being disposed beyond a side of the near-eye display device opposite to an eyes facing side of the near-eye display device transmitting the identified user focal region image data to the near-eye display device using one or more communication techniques satisfying lossless transmission criteria;

identifying within the received image data representing the 3D field of view, at least some secondary image data as corresponding to a 3D secondary region outside the 3D user focal region;

transmitting the identified at least some secondary image data to the near-eye display device using one or more communication techniques allowing for lossy transmission; and causing an updating of the 3D display by the near-eye display device through use of the transmitted user focal region image data and the transmitted at least some secondary image data.

11. The method of claim 10 wherein the at least some secondary image data has a lower image resolution than an image resolution of the user focal region image data.

12. The method of claim 10 further comprising:

identifying natural user input in image data captured by one or more image capture devices of the near-eye display device; and determining the user focal region in the field of view of the near-eye display device based on the natural user input.

13. The method of claim 12 wherein identifying natural user input in the image data captured by one or more image capture devices of the near-eye display device further comprises capturing eye movements with an eye tracking camera.

14. The method of claim 12 wherein identifying natural user input in the image data captured by one or more image capture devices of the near-eye display device further comprises recognizing a pointing gesture from the image data.

15. The method of claim 10 wherein the transmitting of at least some secondary image data using one or more communication techniques allowing for lossy transmission further comprises omitting performing one or more error correction techniques on the at least some secondary image data being within the received image data.

16. A near-eye display device system comprising:

a near-eye support structure;

a near-eye display of a near-eye display device, the display being supported by the near-eye support structure for displaying imagery to spaced away eyes of a user, the display being not bonded to either of the spaced away eyes of the user and the near-eye display device having a three-dimensional (3D) field of view disposed beyond a side of the near-eye display device opposite to an eyes facing side of the near-eye display device, and an image generation unit supported by the near-eye support structure and outputting optical imagery which is optically coupled into the near-eye display for projection display of scenery in the 3D display field of view to the spaced away eyes of the user;

one or more processors communicatively coupled to the image generation unit for controlling the optical imagery which is output by the image generation unit in response to supplied image data;

the one or more processors being configured to determine a 3D user focal region within the 3D field of view of the near-eye display device based on data representing natural user input stored in an accessible memory;

the one or more processors being configured to identify user focal region image data for display corresponding to imagery within the 3D user focal region and to identify secondary image data for display corresponding to imagery outside the 3D user focal region based on one or more applications being executed by the near-eye display device system; and a first communication link communicatively coupled to the one or more processors and communicatively coupled over a communication medium to a computer system, the communication link being configured to use one or more communication techniques for satisfying lossless transmission criteria when receiving user focal region image data from the computer system and being configured to use one or more communication techniques allowing for lossy transmission when receiving the secondary image data from the computer system.

17. The near-eye display device system of claim 16 wherein the first communication link and the one or more processors are supported by the near-eye support structure.

18. The near-eye display device system of claim 16 further comprising a companion processor separate from and communicatively coupled to the near-eye display device wherein the companion processor includes the first communication link.

19. The near-eye display device system of claim 16 further comprising a companion processor separate from and communicatively coupled to the near-eye display device wherein the companion processor is the computer system communicatively coupled to the first communication link; and the companion processor including a second communication link using one or more communication techniques for satisfying lossless transmission criteria when transmitting user focal region image data to the first communication link and using one or more communication techniques allowing for lossy transmission when transmitting secondary image data to the first communication link.

20. The near-eye display device system of claim 19 wherein the companion processor further comprises one or more processors which downsample an image resolution of the secondary image data prior to the second communication link transmitting the secondary image data to the first communication link.

* * * * *